United States Patent
Suemasa et al.

(10) Patent No.: US 11,990,285 B2
(45) Date of Patent: May 21, 2024

(54) MULTI-TERMINAL CAPACITOR HAVING EXTERNAL TERMINALS PROVIDED IN A SPECIFIC MANNER THEREON, METHOD OF MANUFACTURING MULTI-TERMINAL CAPACITOR, AND MULTI-TERMINAL-CAPACITOR-MOUNTED CIRCUIT BOARD

(71) Applicant: TAIYO YUDEN CO., LTD., Tokyo (JP)

(72) Inventors: Riki Suemasa, Tokyo (JP); Takayuki Sekiguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 278 days.

(21) Appl. No.: 17/438,105

(22) PCT Filed: Feb. 19, 2020

(86) PCT No.: PCT/JP2020/006398
§ 371 (c)(1),
(2) Date: Sep. 10, 2021

(87) PCT Pub. No.: WO2020/184096
PCT Pub. Date: Sep. 17, 2020

(65) Prior Publication Data
US 2022/0246361 A1    Aug. 4, 2022

(30) Foreign Application Priority Data

Mar. 13, 2019   (JP) .................. 2019-045522

(51) Int. Cl.
*H01G 4/35*   (2006.01)
*H01G 4/12*   (2006.01)
(Continued)

(52) U.S. Cl.
CPC .................. *H01G 4/35* (2013.01); *H01G 4/12* (2013.01); *H01G 4/232* (2013.01); *H05K 1/181* (2013.01);
(Continued)

(58) Field of Classification Search
CPC ............ H01G 4/35; H01G 4/12; H01G 4/232; H01G 2/06; H01G 4/012; H01G 4/30;
(Continued)

(56) References Cited

U.S. PATENT DOCUMENTS

2006/0126264 A1   6/2006  Yoshii et al.
2010/0182732 A1*  7/2010  Togashi ................. H01G 4/232
                                                          361/303
(Continued)

FOREIGN PATENT DOCUMENTS

JP   2002-505812 A   2/2002
JP   2006-173270 A   6/2006
(Continued)

OTHER PUBLICATIONS

Notice of Reasons for Refusal dated Jan. 17, 2023, issued in corresponding Japanese Patent Application No. 2019-045522, with English translation (14 pgs.).
(Continued)

*Primary Examiner* — David M Sinclair
*Assistant Examiner* — Daniel M Dubuisson
(74) *Attorney, Agent, or Firm* — Pillsbury Winthrop Shaw Pittman, LLP

(57) ABSTRACT

A multi-terminal capacitor is provided that can be used either as a feedthrough capacitor or as a LW reversal capacitor. A multi-terminal capacitor includes a capacitor body shaped like a rectangular parallelepiped. The capacitor body includes a capacitance forming portion configured to form capacitance between a first conductor film and a
(Continued)

second conductor film facing each other with a dielectric film being interposed therebetween. On one of the surfaces of the capacitor body in the third direction, first and second external terminals electrically connected to the first conductor film, and a third external terminal electrically connected to the second conductor film are provided. On the other of the surfaces of the capacitor body in the third direction, fourth and fifth external terminals electrically connected to the first conductor film and a sixth external terminal electrically connected to the second conductor film are provided.

17 Claims, 21 Drawing Sheets

(51) Int. Cl.
*H01G 4/232* (2006.01)
*H05K 1/18* (2006.01)
*H01G 4/252* (2006.01)
*H01G 4/33* (2006.01)

(52) U.S. Cl.
CPC .............. *H01G 4/252* (2013.01); *H01G 4/33* (2013.01); *H05K 2201/10015* (2013.01)

(58) Field of Classification Search
CPC ......... H05K 1/181; H05K 2201/10015; H05K 3/3442; H05K 2201/10045; H05K 2201/10636; H05K 1/111
See application file for complete search history.

(56) References Cited

U.S. PATENT DOCUMENTS

| | | | |
|---|---|---|---|
| 2016/0189867 A1 | 6/2016 | Zaima et al. | |
| 2016/0240319 A1* | 8/2016 | Onoue | H01G 4/232 |
| 2017/0323726 A1* | 11/2017 | Sasaki | H01G 2/06 |
| 2017/0352479 A1* | 12/2017 | Sawada | H01G 4/30 |
| 2018/0035545 A1 | 2/2018 | Lee et al. | |
| 2018/0108480 A1* | 4/2018 | Fujii | H01G 4/012 |
| 2018/0218840 A1* | 8/2018 | Watabe | H01G 4/232 |
| 2018/0294099 A1* | 10/2018 | Makino | H01G 4/232 |
| 2019/0096576 A1* | 3/2019 | Onodera | H01G 4/232 |
| 2020/0137889 A1* | 4/2020 | Yook | H01L 28/91 |

FOREIGN PATENT DOCUMENTS

| | | |
|---|---|---|
| JP | 2006-196811 A | 7/2006 |
| JP | 2011-066331 A | 3/2011 |
| JP | 2016-127262 A | 7/2016 |
| JP | 2018-019066 A | 2/2018 |

OTHER PUBLICATIONS

International Search Report dated Mar. 24, 2020 issued in corresponding International Patent Application No. PCT/JP2020/006398, with English translation (5 pgs.).

\* cited by examiner

MULTI-TERMINAL CAPACITOR HAVING EXTERNAL TERMINALS PROVIDED IN A SPECIFIC MANNER THEREON, METHOD OF MANUFACTURING MULTI-TERMINAL CAPACITOR, AND MULTI-TERMINAL-CAPACITOR-MOUNTED CIRCUIT BOARD

CROSS-REFERENCE TO RELATED APPLICATIONS

This application is the U.S. National Phase Application of PCT/JP2020/006398, filed on Feb. 19, 2020, which claims the benefit of priority from Japanese Patent Application Serial No. 2019-045522 (filed on Mar. 13, 2019), the contents of each of which are incorporated herein by reference in entirety.

TECHNICAL FIELD

The present invention relates to a multi-terminal capacitor, a method of manufacturing the same, and a multi-terminal-capacitor-mounted circuit board constituted by a circuit board and the multi-terminal capacitor mounted on the circuit board.

BACKGROUND

Capacitors may be mounted on circuit boards for the purposes of eliminating noise and reducing voltage variation. One of such known capacitors is a feedthrough capacitor FTC shown in FIG. 1A (see Patent Literature 1) and another one is a LW reversal capacitor LWRC shown in FIG. 2A (see Patent Literature 2).

The feedthrough capacitor FTC shown in FIG. 1A has a capacitor body CE shaped like a rectangular parallel piped, first and second external terminals ET1 and ET2 at the edges of the capacitor body CE in a d1 direction, and third and fourth external terminals ET3 and ET4 at the middle of the edges of the capacitor body CE in a d2 direction. The capacitor body CE has a plurality of first internal electrode layers (not shown) and a plurality of second internal electrode layers (not shown) stacked on each other with dielectric layers (not shown) being interposed therebetween. Each first internal electrode layer is connected at one of the edges thereof to the first external terminal ET1 and at the other edge thereof to the second external terminal ET2, and each second internal electrode layer is connected at one of the edges thereof to the third external terminal ET3 and at the other edge thereof to the fourth external terminal ET4.

FIG. 1B shows, as an example, pads used to mount the feedthrough capacitor FTC to a circuit board CB. In FIG. 1B, the reference signs SP1 and SP2 denote signal pads, and the reference signs GP1 and GP2 denote ground pads. FIG. 1C shows, as an example, how the feedthrough capacitor FTC is mounted onto the circuit board CB. The first and second external terminals ET1 and ET2 of the feedthrough capacitor FTC are respectively connected to the signal pads SP1 and SP2, and the third and fourth external terminals ET3 and ET4 are respectively connected to the ground pads GP1 and GP2.

The LW reversal capacitor LWRC shown in FIG. 2A, on the other hand, has a capacitor body CE shaped like a rectangular parallel piped, first and second external terminals ET1 and ET2 at the edges of the capacitor body CE in a d1 direction, and the capacitor body CE has a smaller dimension in the d1 direction than in the d2 direction. The capacitor body CE has a plurality of first internal electrode layers (not shown) and a plurality of second internal electrode layers (not shown) stacked on each other with dielectric layers (not shown) being interposed therebetween. Each first internal electrode layer is connected at one of the edges thereof to the first external terminal ET1, and each second internal electrode layer is connected at one of the edges thereof to the second external terminal ET2.

FIG. 2B shows, as an example, pads used to mount the LW reversal capacitor LWRC to a circuit board CB. In FIG. 2B, the reference signs SP and GP respectively denote a signal pad and a ground pad. FIG. 2C shows, as an example, how the LW reversal capacitor LWRC is mounted onto the circuit board CB. The LW reversal capacitor LWRC is connected at the first external terminal ET1 to the signal pad SP1, and at the second external terminal ET2 to the ground pad GP.

Here, electronic devices such as smartphones and notebook computers have a large number of capacitors mounted on the circuit board for the purposes of eliminating noise and reducing voltage variation. Such capacitors often include both feedthrough capacitors, an example of which is shown in FIG. 1A, and LW reversal capacitors, an example of which is shown in FIG. 2A. In many cases, feedthrough and LW reversal capacitors having the same size and capacitance are used together.

The feedthrough and LW reversal capacitors are, however, of different types in terms of the number and position of the external terminals, as described above. Accordingly, the feedthrough and LW reversal capacitors need to be separately prepared even in a case where they have the same size and capacitance. Here, two or more types of capacitors may need to be prepared, and capacitors of each type may need to have the same size and capacitance. In such a case, for each type, feedthrough and LW reversal capacitors need to be separately prepared. This may complicate the storage and management of the feedthrough and LW reversal capacitors, and the complicated manner of storage and management may hinder the reduction in cost of producing electronic-component-mounted circuit boards, which each include a circuit board and electronic components including capacitors mounted on the circuit board.

RELEVANT REFERENCES

List of Relevant Patent Literature

Patent Literature 1: Japanese Patent Application Publication No. 2018-019066
Patent Literature 2: Japanese Patent Application Publication No. 2006-173270

SUMMARY

An object of the present invention is to provide a multi-terminal capacitor that can be used either as a feedthrough capacitor or a LW reversal capacitor and a method of manufacturing the same, and a multi-terminal-capacitor-mounted circuit board constituted by a circuit board and the multi-terminal capacitor mounted on the circuit board as a feedthrough or LW reversal capacitor.

To solve the above problems, a multi-terminal capacitor relating to the present invention includes a capacitor body shaped like a rectangular parallelepiped, where the capacitor body includes a capacitance forming portion configured to form capacitance between a first conductor film and a second conductor film facing each other with a dielectric film being interposed therebetween. When first, second and third directions respectively denotes a direction in which two opposing surfaces of the capacitor body face each other, a direction in which other two opposing surfaces face each other, and a direction in which the remaining two opposing surfaces face each other, first, second and third external terminals are provided on one of surfaces of the capacitor body in the third direction, the first and second external terminals are electrically connected to the first conductor film, the third external terminal is electrically connected to the second conductor film, fourth, fifth and sixth external terminals are provided on the other of the surfaces of the capacitor body in the third direction, the fourth and fifth external terminals are electrically connected to the first conductor film, the sixth external terminal is electrically connected to the second conductor film, the first, second and third external terminals are configured such that the capacitance formed by the capacitance forming portion is extracted by the first, second and third external terminals, and the fourth, fifth and sixth external terminals are configured such that the capacitance formed by the capacitance forming portion is extracted by the fourth, fifth and sixth external terminals.

A method of manufacturing a multi-terminal capacitor relating to the present invention includes steps of making a capacitor body shaped like a rectangular parallelepiped, where the capacitor body includes a capacitance forming portion configured to form capacitance between a first conductor film and a second conductor film facing each other with a dielectric film being interposed therebetween, and making (i) first, second and third external terminals such that the capacitance formed by the capacitance forming portion is extracted by the first, second and third external terminals and (ii) fourth, fifth and sixth external terminals such that the capacitance formed by the capacitance forming portion is extracted by the fourth, fifth and sixth external terminals. When first, second and third directions respectively denote a direction in which two opposing surfaces of the capacitor body face each other, a direction in which other two opposing surfaces face each other, and a direction in which the remaining two opposing surfaces face each other, the first, second and third external terminals are provided on one of surfaces of the capacitor body in the third direction, the first and second external terminals are electrically connected to the first conductor film, the third external terminal is electrically connected to the second conductor film, fourth, fifth and sixth external terminals are provided on the other of the surfaces of the capacitor body in the third direction, the fourth and fifth external terminals are electrically connected to the first conductor film, the sixth external terminal is electrically connected to the second conductor film.

A multi-terminal-capacitor-mounted circuit board relating to the present invention includes a circuit board, and the above-described multi-terminal capacitor mounted on the circuit board using the first, second and third external terminals. Alternatively, the above-described multi-terminal capacitor is mounted on the circuit board using the fourth, fifth and sixth external terminals.

Advantageous Effects

According to the multi-terminal capacitor relating to the present invention and the method of manufacturing the same, a multi-terminal capacitor can be provided that can be used either as a feedthrough capacitor or as a LW reversal capacitor. According to the multi-terminal-capacitor-mounted circuit board relating to the present invention, a multi-terminal-capacitor-mounted circuit board can be provided that includes a circuit board and the above-described multi-terminal capacitor mounted on the circuit board as a feedthrough or LW reversal capacitor.

DESCRIPTION OF THE PREFERRED EMBODIMENTS

Figure 1A:
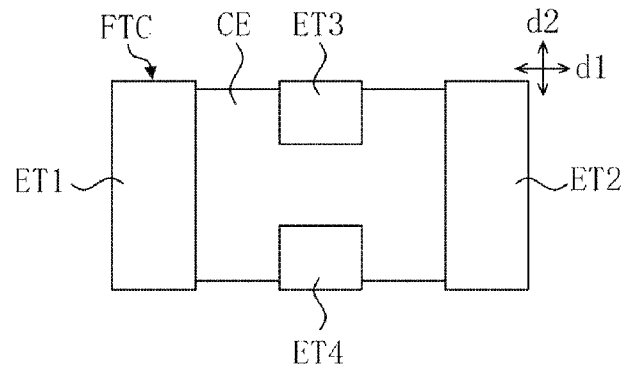
FIGS. 1A to 1C show, as an example, a conventional feedthrough capacitor, pads used to mount the feedthrough capacitor onto a circuit board, and how the feedthrough capacitor is mounted on the circuit board.
Figure 1B:
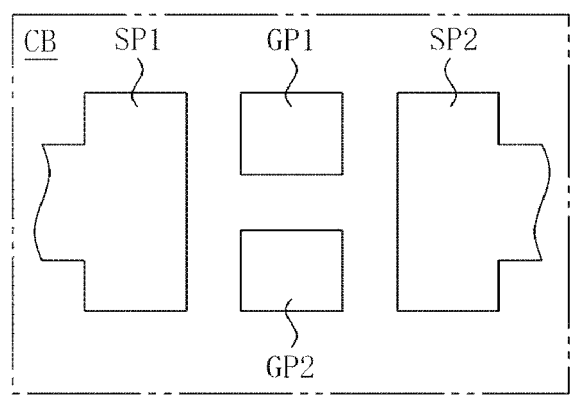
Figure 1C:
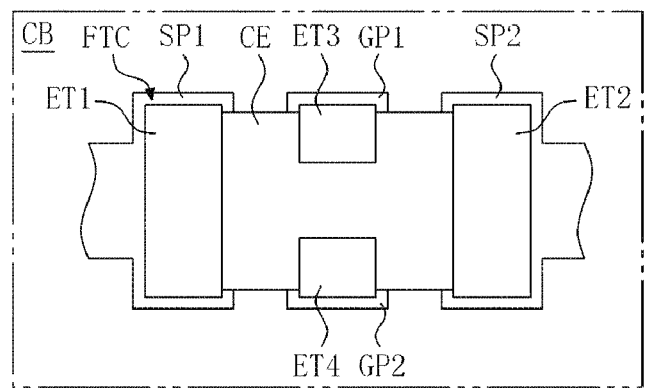
Figure 2A:
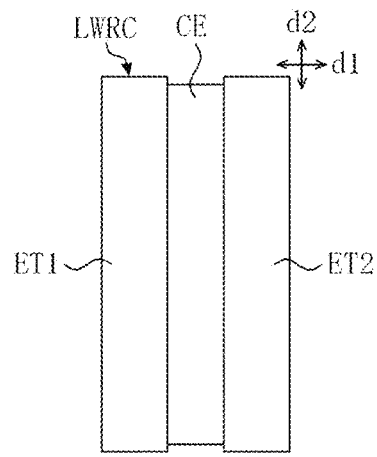
FIGS. 2A to 2C show, as an example, a conventional LW reversal capacitor, pads used to mount the LW reversal capacitor onto a circuit board, and how the LW reversal capacitor is mounted on the circuit board.
Figure 2B:
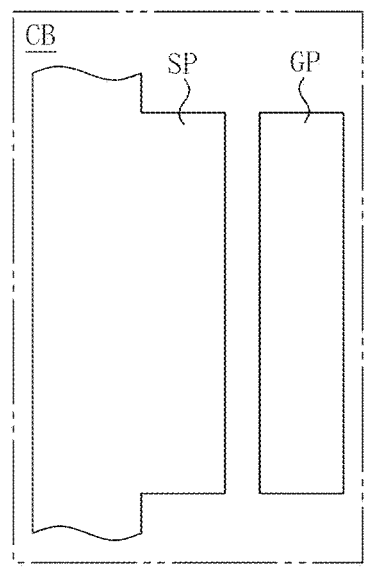
Figure 2C:
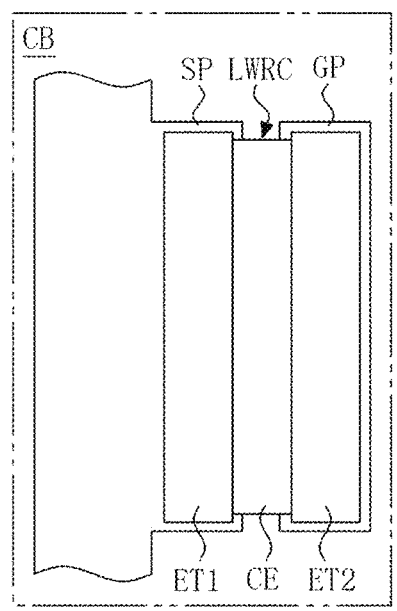
Figure 3A:
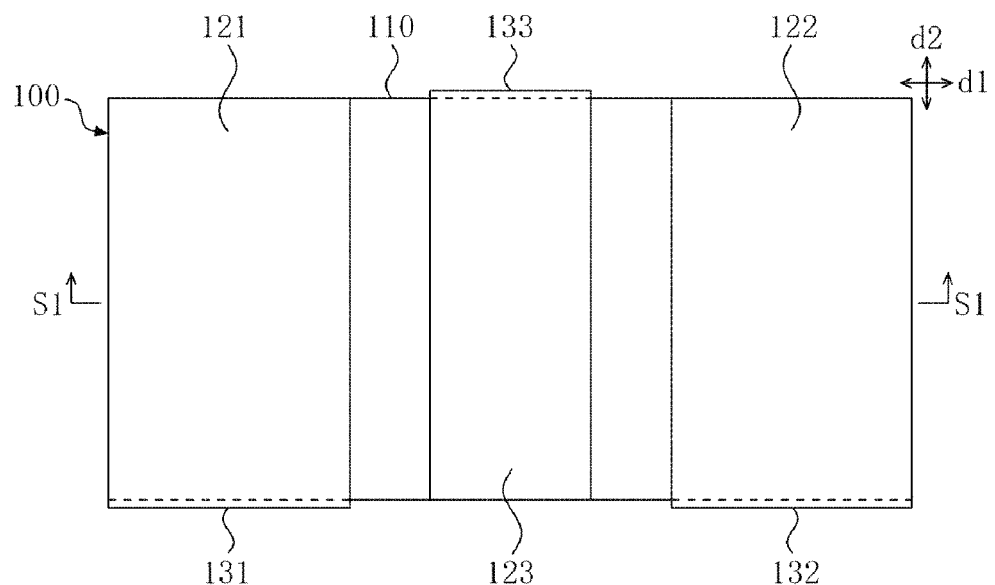
FIG. 3A is a plan view of a multi-terminal capacitor relating to an application example of the present invention.

In the following description, a first direction d1, a second direction d2 and a third direction d3 respectively refer to the direction in which two opposing surfaces of a capacitor body 110, which will be described below, face each other (the left-right direction in FIG. 3A), the direction in which other two opposing surfaces face each other (the top-bottom direction in FIG. 3A), and the direction in which the remaining two opposing surfaces face each other (the top-bottom direction in FIG. 3B), and the directions specified in other drawings than FIGS. 3A and 3B should be understood in the same manner as above.

In addition, "a first-direction dimension D1 [the reference numeral assigned to a constituent element]), "a second-direction dimension D2 [the reference numeral assigned to the constituent element), and "a third-direction dimension D3 [the reference numeral assigned to the constituent element]) respectively denote the dimensions of the constituent element in the first, second and third directions d1, d2 and d3. Note that, however, the term "thickness" will be also used to describe a first conductor film 112, a dielectric film 113, a second conductor film 114, a first protective layer 115, a second protective layer 116, and first to sixth external terminals 121 to 126, first to third coupling conductor portion 131 to 133, which will be described below, for the sake of facilitation of understanding. The numerical values mentioned as example dimensions only refer to reference dimensions as designed and do not include manufacturing tolerances.

A multi-terminal capacitor 100, an example implementation of the present invention, will be described in the below with reference to FIGS. 3A to 4C and, as required, FIG. 6A to FIG. 11B.

As shown in FIGS. 3A to 3D, the multi-terminal capacitor 100 includes a capacitor body 110 shaped like a rectangular parallelepiped, first, second and third external terminals 121, 122 and 123 provided on one of the surfaces of the capacitor body 100 in the third direction d3 (the top surface in FIG. 3B), fourth, fifth and sixth external terminals 124, 125 and 126 provided on the other of the surfaces of the capacitor body 100 in the third direction d3 (the bottom surface in FIG. 3B), a first coupling conductor portion 131 coupling together the first and fourth external terminals 121 and 124, a second coupling conductor portion 132 coupling together the second and fifth external terminals 122 and 125, and a third coupling conductor portion 133 coupling together the third and sixth external terminals 123 and 126.

<Capacitor Body>

The capacitor body 110 is described with reference to FIGS. 3A to 3D. For the capacitor body 110, the first-direction dimension D1 [110] is greater than the second-direction dimension D2 [110], and the third-direction dimension D3 [110] is less than the second-direction dimension D2 [110]. The numerical values of the first-, second- and third-direction dimensions D1 [110], D2 [110] and D3 [110] are not limited in a particular manner as long as the relation of the first-direction dimension D1 [110]>the second-direction dimension D2 [110] or, additionally, the relation of the third-direction dimension D3 [110]<the second-direction dimension D2 [110] are satisfied.

If the multi-terminal capacitor 100 is small and thin, the first-direction dimension D1 [110] of the capacitor body 110 can be within the range of 400 to 1600 μm, the second-direction dimension D2 [110] can be within the range of 200 to 800 μm, and the third-direction dimension D3 [110] can be 100 μm or less, or 50 μm or less.

The capacitor body 110 includes a substrate portion 111 (see FIGS. 4A, 5A and 5B) having a plurality of through holes 111a formed therein and shaped like a rectangular parallelepiped, a first conductor film 112 (see FIGS. 4A, 6A and 6B) continuously covering one of the surfaces of the substrate portion 111 in the third direction d3 (the top surface in FIG. 4A), the other surface in the third direction d3 (the bottom surface in FIG. 4A) and the inner wall of the through holes 111a, a dielectric film 113 (see FIGS. 4A and 7A and 7B) covering the first conductor film 112, and a second conductor film 114 (FIGS. 4A and 8A and 8B) covering the dielectric film 113. In the capacitor body 110, a capacitance forming portion (no reference numeral assigned) is configured between the first and second conductor films 112 and 113, which face each other with the dielectric film 113 being provided therebetween. The capacitance forming portion is configured to form capacitance.

The substrate portion 111 and through holes 111a are described with reference to FIGS. 5A to 5C. For the substrate portion 111, the first-direction dimension D1 [111] is greater than the second-direction dimension D2 [111], and the third-direction dimension D3 [111] is less than the second-direction dimension D2 [111]. The through holes 111a are shaped like a rectangular cylinder with its first-direction dimension D1 [111a] being greater than the second-direction dimension D2 [111a]. There are, in total, 105 through holes 111a, which are arranged in a lattice pattern with seven in the first direction d1 and 15 in the second direction d2. The through holes 111a are arranged at even intervals in the first and second directions d1 and d2.

If the multi-terminal capacitor 100 is small and thin, the numerical values of the first-, second-, and third-direction dimensions D1 [111], D2 [111] and D3 [111] of the substrate portion 111 may be determined in any manner as long as the numerical values of the first-, second-, and third-direction dimensions D1 [110], D2 [110] and D3 [110] of the capacitor body 110 are within the above-mentioned range. For the through holes 111a, the first-direction dimension D1 [111a] may be, for example, within the range of 5 to 20 μm, the second-direction dimension D2 [111a] may be, for example, within the range of 0.5 to 2 μm, and the through holes 111a are arranged at intervals of for example, 1 to 10 μm in the first direction d1 and at intervals of, for example, 0.5 to 2 μm in the second direction d2.

Figure 5A:
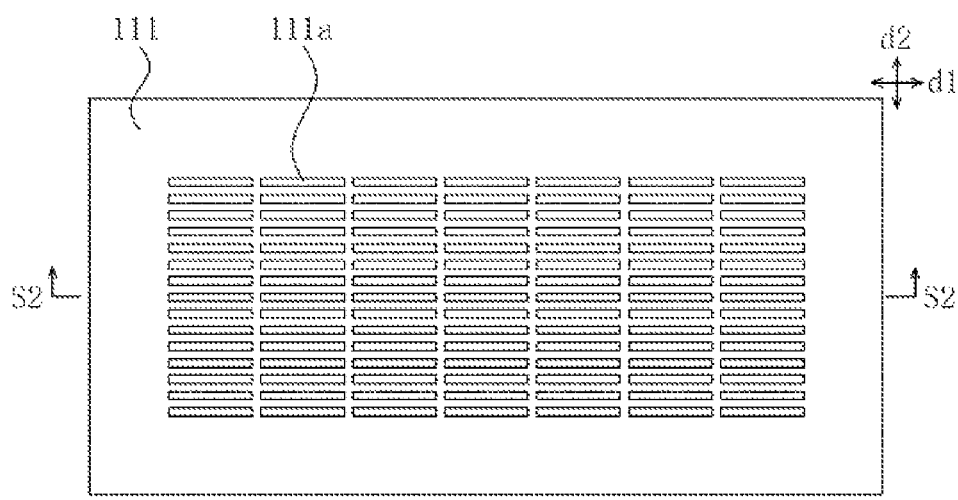
FIG. 5A is a plan view corresponding to FIG. 3A and showing a substrate portion shown in FIG. 4A.
Figure 5B:
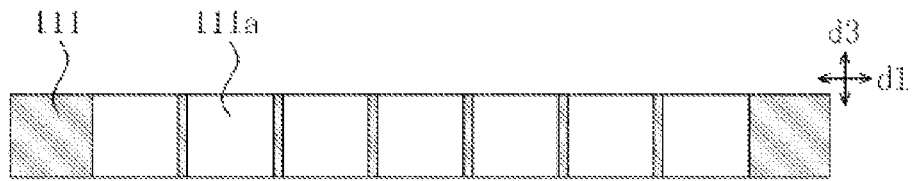
FIG. 5B is a sectional view showing a section along a line S2-S2 in FIG. 5A.

FIGS. 5A and 5B show, as an example, 105 through holes 111a, but the total number of the through holes 111a can be adjusted in accordance with the size of the substrate portion 111, the capacitance described below, and other factors. The through holes 111a described above as an example satisfy the relation of the first-direction dimension D1 [111a]>the second-direction dimension D2 [111a], but they may alternatively satisfy the relation of the first-direction dimension D1 [111a]=the second-direction wise dimension D2 [111a] or the relation of the first-direction dimension D1 [111a]<the second-direction dimension D2 [111a]. The through holes 111a described above as an example are shaped like a rectangular cylinder, but can be alternatively shaped like a prism having bases shaped like a polygon (a pentagon, a hexagon, or the like) or cylinder having circular or elliptic bases, provided that the capacitance of the same level as described below can be formed. The through holes 111a described above as an example are arranged in a lattice pattern, but can be alternatively arranged in a zigzag pattern provided that the capacitance of the same level as described below can be formed.

The first conductor film 112 includes a first planar portion 112a (see FIG. 6B) shaped like a rectangle and provided on one of the surfaces of the substrate portion 111 in the third direction d3 (the top surface in FIG. 4A), a second planar portion 112b (see FIG. 6B) shaped like a rectangle and provided on the other of the surfaces of the substrate portion 111 in the third direction d3 (the bottom surface in FIG. 4A), and tubular portions 112c (see FIG. 6B) shaped like a rectangular column and provided in the through holes 111a in the substrate portion 111, which are integrally formed.

The dielectric film 113 includes a first planar portion 113a (see FIG. 7B) shaped like a rectangle and provided on one of the surfaces of the substrate portion 111 in the third direction d3 (the top surface in FIG. 4A), a second planar portion 113b (see FIG. 7B) shaped like a rectangle and provided on the other of the surfaces of the substrate portion 111 in the third direction d3 (the bottom surface in FIG. 4A), and tubular portions 113c (see FIG. 7B) shaped like a rectangular column and provided in the through holes 111a in the substrate portion 111, which are integrally formed.

The second conductor film 114 includes a first planar portion 114a (see FIG. 8B) shaped like a rectangle and provided on one of the surfaces of the substrate portion 111 in the third direction d3 (the top surface in FIG. 4A), a second planar portion 114b (see FIG. 8B) shaped like a rectangle and provided on the other of the surfaces of the substrate portion 111 in the third direction d3 (the bottom surface in FIG. 4A), and tubular portions 114c (see FIG. 8B) shaped like a rectangular column and provided in the through holes 111a in the substrate portion 111, which are integrally formed.

The first and second conductor films 112 and 114 and the dielectric film 113 are described with reference to FIGS. 6A to 8B. For the first and second planar portions 112a and 112b of the first conductor film 112, their first-direction dimensions D1 [112a] [112b] are greater than their second-direction dimensions D2 [112a] [112b], their first-direction dimensions D1 [112a] [112b] are less than the first-direction dimension D1 [111] of the substrate portion 111, and their second-direction dimensions D2 [112a] [112b] are less than the second-direction dimension D2 [111] of the substrate portion 111.

For the first and second planar portions 113a and 113b of the dielectric film 113, their first-direction dimensions D1 [113a] [113b] are greater than their second-direction dimensions D2 [113a] [113b], the first-direction dimensions D1 [113a] [113b] are less than the first-direction dimensions D1 [112a] [112b] of the first and second planar portions 112a and 112b of the first conductor film 112, and the second-direction dimensions D2 [113a] [113b] are less than the second-direction dimensions D2 [112a] [112b] of the first and second planar portions 112a and 112b of the first conductor film 112.

For the first and second planar portions 114a and 114b of the second conductor film 114, their first-direction dimensions D1 [114a] [114b] are greater than their second-direction dimensions D2 [114a] [114b], the first-direction dimensions D1 [114a] [114b] are less than the first-direction dimension D1 [113a] [113b] of the first and second planar portions 113a and 113b of the dielectric film 113, and the second-direction dimensions D2 [114a] [114b] are less than the second-direction dimension D2 [113a] [113b] of the first and second planar portions 113a and 113b of the dielectric film 113. The dimensions are determined as above for the reasons related to manufacturing of first to fourth connecting conductor portions 117a to 117d, which will be described below, and manufacturing of fifth to seventh connecting conductor portions 118a to 118c, which will be described below.

If the multi-terminal capacitor 100 is small and thin, the numerical values of the first-direction dimensions D1 [112a] [112b] and the second-direction dimensions D2 [112a] [112b] of the first and second planar portions 112a and 112b of the first conductor film 112, the numerical values of the first-direction dimensions D1 [113a] [113b] and the second-direction dimensions D2 [113a] [113b] of the first and second planar portions 113a and 113b of the dielectric film 113, and the numerical values of the first-direction dimension D1 [114a] [114b] and the second-direction dimension D2 [114a] [114b] of the first and second planar portions 114a and 114b of the second conductor film 114 are not limited in any particular manner, provided that they satisfy the relations described previously and that the numerical values of the first- and second-direction dimensions D1 [110] and D2 [110] of the capacitor body 110 fall within the above-mentioned range. The first and second conductor films 112 and 114 and the dielectric film 113 can have a thickness in the range of 1 to 500 nm, for example.

The above-described capacitance forming portion (the reference numeral not specified) is configured to form the above-described capacitance through (i) partial capacitance that can be formed by the first planar portion 112a of the first conductor film 112, the first planar portion 113a of the dielectric film 113 and the first planar portion 114a of the second conductor film 114 provided on one of the surfaces of the substrate portion 111 in the third direction d3 (the top surface in FIG. 4A), (ii) partial capacitance that can be formed by the second planar portion 112b of the first conductor film 112, the second planar portion 113b of the dielectric film 113 and the second planar portion 114b of the second conductor film 114 provided on the other of the surface of the substrate portion 111 in the third direction d3 (the bottom surface in FIG. 4A) and (iii) partial capacitance that can be formed by the tubular portions 112c of the first conductor film 112, the tubular portions 113c of the dielectric film 113 and the tubular portions 114c of the second conductor film 114 provided in the through holes 111a in the substrate portion 111.

Figure 9A:
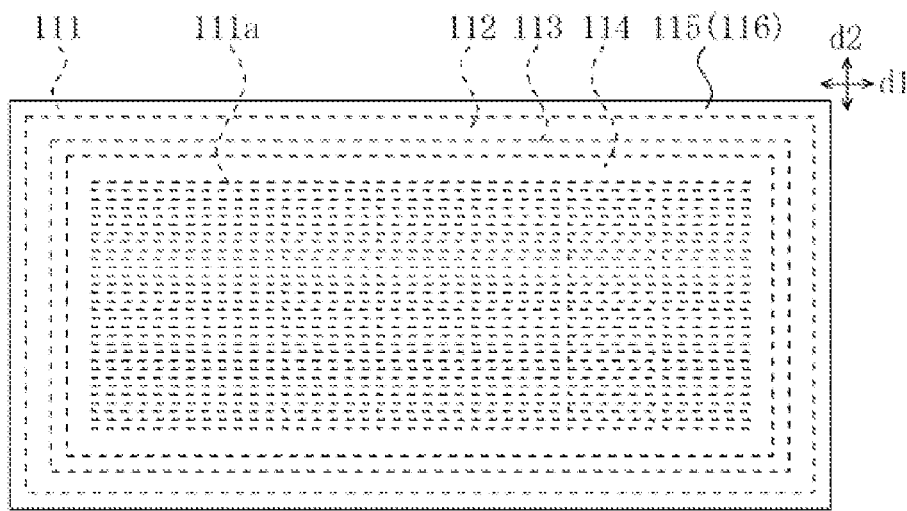
FIGS. 9A and 9B illustrates a protective film making step.
Figure 9B:
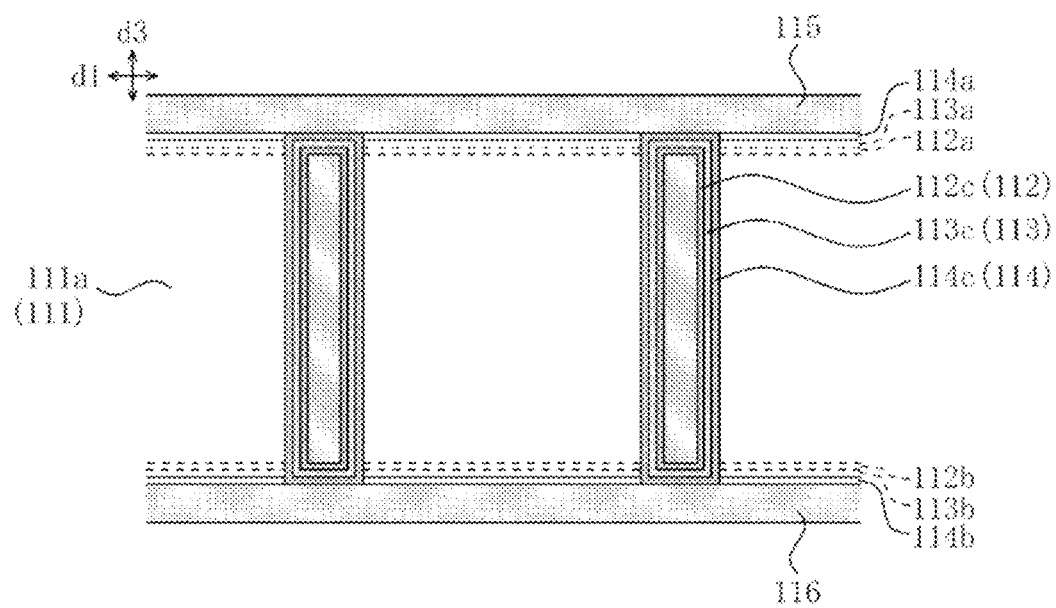
Figure 10A:
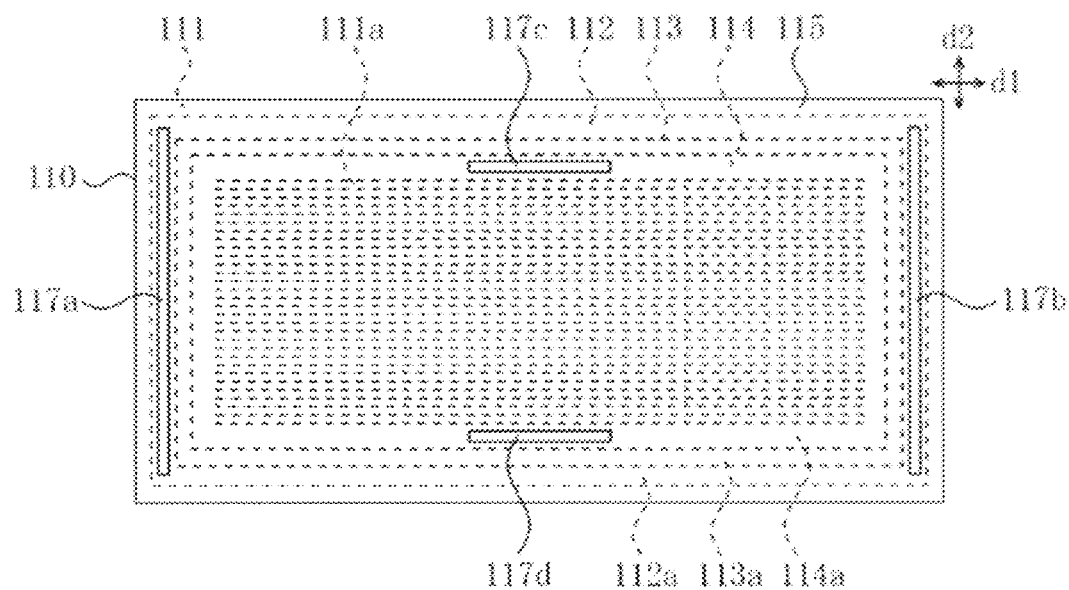
FIGS. 10A to 10D illustrate a connecting conductor portion making step.
Figure 10B:
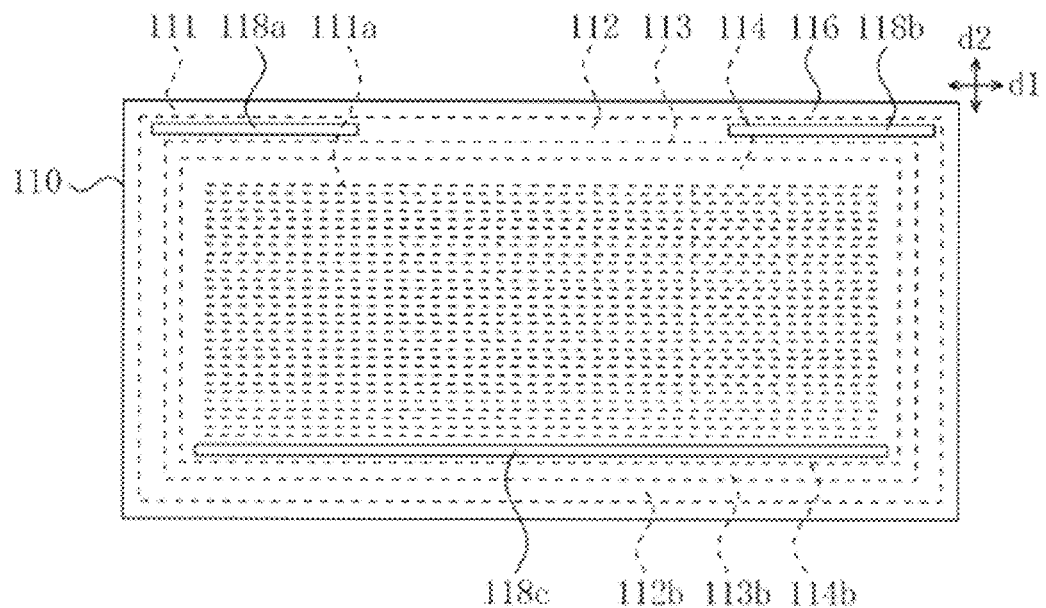
Figure 10C:
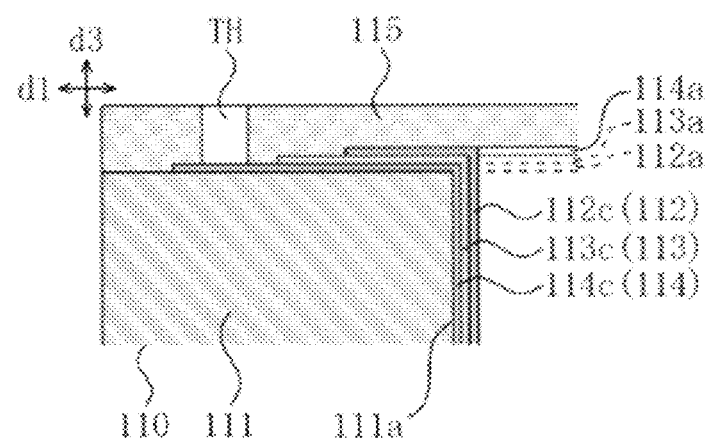

The capacitor body 110 includes a first protective film 115 (see FIGS. 4A and 9A), a second protective film 116 (see FIGS. 4A and 9B), first to fourth connecting conductor portions 117a to 117d (see FIG. 10A), and fifth to seventh connecting conductor portions 118a to 118c (see FIG. 10B). The first protective film 115 covers and hides the first planar portions 112a, 113a and 114a of the first conductor film 112, dielectric film 113 and second conductor film 114 provided on one of the surfaces of the substrate portion 111 in the third direction d3 (the top surface in FIG. 4A). The second protective film 116 covers and hides the second planar portions 112b, 113b and 114b of the first conductor film 112, dielectric film 113 and second conductor film 114 provided on the other of the surfaces of the substrate portion 111 in the third direction d3 (the bottom surface in FIG. 4A). The first to fourth connecting conductor portions 117a to 117d are provided on the first protective film 115, and the fifth to seventh connecting conductor portions 118a to 118c are provided on the second protective film 116.

The first and second protective films 115 and 116 are described with reference to FIGS. 9A and 9B. The first- and second-direction dimensions D1 [115] and D2 [115] of the first protective film 115 are the same or substantially the same as the first- and second-direction dimensions D1 [111] and D2 [111] of the substrate portion 111, and so are the first- and second-direction dimensions D1 [116] and D2 [116] of the second protective film 116.

If the multi-terminal capacitor 100 is small and thin, the numerical values of the first- and second-direction dimensions D1 [115] and D2 [115] of the first protective film 115 and the numerical values of the first- and second-direction dimensions D1 [116] and D2 [116] of the second protective film 116 may be determined in any manner as long as the numerical values of the first- and second-direction dimensions D1 [110] and D2 [110] of the capacitor body 110 fall within the above-mentioned range. The first and second protective films 115 and 116 can have a thickness of, for example, 0.2 to 5 μm.

The first to fourth connecting conductor portions 117a to 117d are described with reference to FIGS. 10A to 10D. The first connecting conductor portion 117a extends, in the third direction d3, through one of the edges of the first protective film 115 in the first direction d1 (the left edge in FIG. 10A) and touches one of the edges of the first planar portion 112a of the first conductor film 112 in the first direction d1 (the left edge in FIG. 10A). The first-direction dimension D1 [117a] of the first connecting conductor portion 117a is less than its second-direction dimension D2 [117a], and the second-direction dimension D2 [117a] is slightly less than the second-direction dimension D2 [112a] of the first planar portion 112a of the first conductor film 112.

The second connecting conductor portion 117b extends, in the third direction d3, through the other of the edges of the first protective film 115 in the first direction d1 (the right edge in FIG. 10A) and touches the other of the edges of the first planar portion 112a of the first conductor film 112 (the right edge in FIG. 10A). The first-direction dimension D1 [117b] of the second connecting conductor portion 117b is less than its second-direction dimension D2 [117b], and the second-direction dimension D2 [117b] is slightly less than the second-direction dimension D2 [112a] of the first planar portion 112a of the first conductor film 112.

The third connecting conductor portion 117c extends, in the third direction d3, through the middle in the first direction d1 of one of the edges of the first protective film 115 (the middle in the left-right direction of the top edge in FIG. 10A) and touches the middle in the first direction d1 of one of the edges of the first planar portion 114a of the second conductor film 114 (the middle in the left-right direction of the top edge in FIG. 10A). The first-direction dimension D1 [117c] of the third connecting conductor portion 117c is greater than its second-direction dimension D2 [117c], and the first-direction dimension D1 [117c] is slightly less than the first-direction dimension D1 [123] of the third external terminal 123.

The fourth connecting conductor portion 117d extends, in the third direction d3, through the middle in the first direction d1 of the other of the edges of the first protective film 115 (the middle in the left-right direction of the bottom edge in FIG. 10A) and touches the middle in the first direction d1 of the other of the edges of the first planar portion 114a of the second conductor film 114 (the middle in the left-right direction of the bottom edge in FIG. 10A). The first-direction dimension D1 [117d] of the fourth connecting conductor portion 117d is greater than its second-direction dimension D2 [117d], and the first-direction dimension D1 [117d] is slightly less than the first-direction dimension D1 [123] of the third external terminal 123.

If the multi-terminal capacitor 100 is small and thin, the first and second connecting conductor portions 117a and 117b are preferably sized such that their first-direction dimensions D1 [117a] and D1 [117b] and second-direction-wise sized D2 [117a] and D2 [117b] are as large as possible, thereby preventing an increase in connection resistance between the first conductor film 112 and one of the first and second external terminals 121 and 122. Similarly, the third and fourth connecting conductor portions 117c and 117d are preferably sized such that their first-direction dimensions D1 [117c] and D2 [117d] and second-direction dimensions D2 [117c] and D2 [117d] are as large as possible, thereby preventing an increase in connection resistance between the second conductor film 114 and the third external terminal 123. The third-direction dimensions D3 [117a] to D3 [117d] of the first to fourth connecting conductor portions 117a to 117d are the same as or slightly larger than the thickness of the first protective film 115.

The fifth to seventh connecting conductor portions 118a to 118c are described with reference to FIGS. 10A to 10D. The fifth connecting conductor portion 118a extends, in the third direction d3, through one of the edges of the second protective film 116 in the second direction d2 at one of the sides in the first direction d1 (the left-side portion of the top edge in FIG. 10B) and touches one of the edges of the second planar portion 112b of the first conductor film 112 in the second direction d2 at one of the sides in the first direction d1 (the left-side portion of the top edge in FIG. 10B). The first-direction dimension D1 [118a] of the fifth connecting conductor portion 118a is greater than its second-direction dimension D2 [118a], and the first-direction dimension D1 [118a] is slightly less than the first-direction dimension D1 [124] of the fourth external terminal 124.

The sixth connecting conductor portion 118b extends, in the third direction d3, through one of the edges of the second protective film 116 in the second direction d2 at the other of the sides in the first direction d1 (the right-side portion of the top edge in FIG. 10B) and touches one of the edges of the second planar portion 112b of the first conductor film 112 in the second direction d2 at the other of the sides in the first direction d1 (the right-side portion of the top edge in FIG. 10B). The first-direction dimension D1 [118b] of the sixth connecting conductor portion 118b is greater than its second-direction dimension D2 [118b], and the first-direction dimension D1 [118b] is slightly less than the first-direction dimension D1 [125] of the fifth external terminal 125.

The seventh connecting conductor portion 118c extends, in the third direction d3, through the other of the edges of the second protective film 116 in the second direction d2 (the bottom edge in FIG. 10B) and touches one of the edges of the second planar portion 114b of the second conductor film 114 (the bottom edge in FIG. 10B). The first-direction dimension D1 [118c] of the seventh connecting conductor portion 118c is greater than its second-direction dimension D2 [118c], and the first-direction dimension D1 [118b] is slightly less than the first-direction dimension D1 [114b] of the second planar portion 114b of the second conductor film 114.

If the multi-terminal capacitor 100 is small and thin, the fifth and sixth connecting conductor portions 118a and 118b are preferably sized such that their first-direction dimensions D1 [118a] and D1 [118b] and second-direction dimensions D2 [118a] and D1 [118b] are as large as possible, thereby preventing an increase in connection resistance between the first conductor film 112 and one of the fourth and fifth external terminals 124 and 125. Similarly, the seventh connecting conductor portion 118c is preferably sized such that its first-direction dimension D1 [118c] and second-direction dimension D2 [118c] are as large as possible, thereby preventing an increase in connection resistance between the second conductor film 112 and the sixth external terminal 126. The third-direction dimension D3 [118a] to D3 [118c] of the fifth to seventh connecting conductors 118a to 118c are the same as or slightly larger than the thickness of the second protective film 116.

<External Terminals>

The first to third external terminals 121 to 123 are described with reference to FIGS. 3A to 3D. The first external terminal 121 is shaped like a rectangle and provided on one of the surfaces of the capacitor body 110 in the third direction d3 at one of the edges in the first direction d1 (the left edge in FIG. 3A). The first-direction dimension D1 [121] of the first external terminal 121 is less than half the first-direction dimension D1 [110] of the capacitor body 110, and its second-direction dimension D2 [121] is the same as or substantially the same as the second-direction dimension D2 [110] of the capacitor body 110.

The second external terminal 122 is shaped like a rectangle, provided on one of the surfaces of the capacitor body 110 in the third direction d3 at the other of the edges in the first direction d1 (the right edge in FIG. 3A), and spaced away from the first external terminal 121 in the first direction d1. The first-direction dimension D1 [122] of the second external terminal 122 is less than half the first-direction dimension D1 [110] of the capacitor body 110, and its second-direction dimension D2 [121] is the same as or substantially the same as the second-direction dimension D2 [110] of the capacitor body 110. FIGS. 3A to 3D illustrate a case where the first- and second-direction dimensions D1 [122] and D2 [122] of the second external terminal 122 are the same as the first- and second-direction dimensions D1 [121] and D2 [121] of the first external terminal 121.

The third external terminal 123 is shaped like a rectangle, provided on one of the surfaces of the capacitor body 110 in the third direction d3, positioned between the first and second external terminals 121 and 122 (at the middle in the left-right direction in FIG. 3A), and in contact with neither the first external terminal 121 nor the second external terminal 122. The first-direction dimension D1 [123] of the third external terminal 123 is less than its second-direction dimension D2 [123], and the second-direction dimension D2 [123] is the same as or substantially the same as the second-direction dimension D2 [110] of the capacitor body 110.

If the multi-terminal capacitor 100 is small and thin, the first, second and third external terminals 121, 122 and 123 are preferably sized such that their first-direction dimensions D1 [121] to D1 [123] and second-direction dimensions D2 [121] to D2 [123] are as large as possible, thereby preventing an increase in connection resistance when the multi-terminal capacitor 100 is mounted on a circuit board 200, which will be described below. The distance between the first and third external terminals 121 and 123 (the distance in the first direction d1) and the distance between the second and third external terminals 122 and 123 (the distance in the first direction d1) are preferably 100 μm or more for the purpose of preventing a bonding material, which is used to mount the multi-terminal capacitor 100 onto the circuit board 200, from causing a short circuit. The first, second and third external terminals 121, 122 and 123 can have a thickness of, for example, 5 to 10 μm.

The fourth to sixth external terminals 124 to 126 are described with reference to FIGS. 3A to 3D. The fourth external terminal 124 is shaped like a rectangle and provided on the other of the surfaces of the capacitor body 110 in the third direction d3 at one of the edges in the second direction d2 on one of the sides (the left-side portion of the top edge in FIG. 3C). The first-direction dimension D1 [124] of the fourth external terminal 124 is the same or substantially the same as the first-direction dimension D1 [121] of the first external terminal 121, and its second-direction dimension D2 [124] is less than half the second-direction dimension D2 [110] of the capacitor body 110.

Figure 3B:
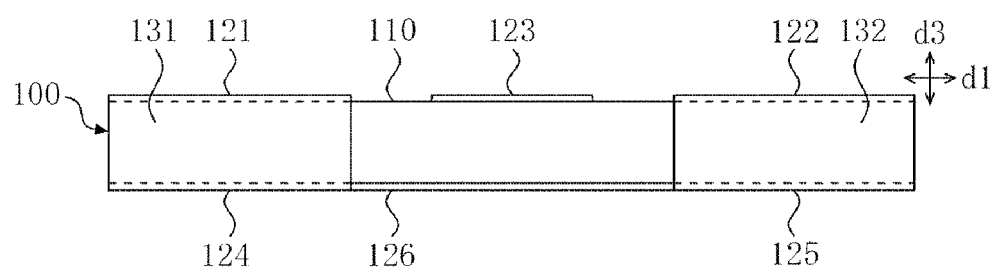
FIG. 3B is a side view of the multi-terminal capacitor, showing the surface on the lower side in FIG. 3A.
Figure 3C:
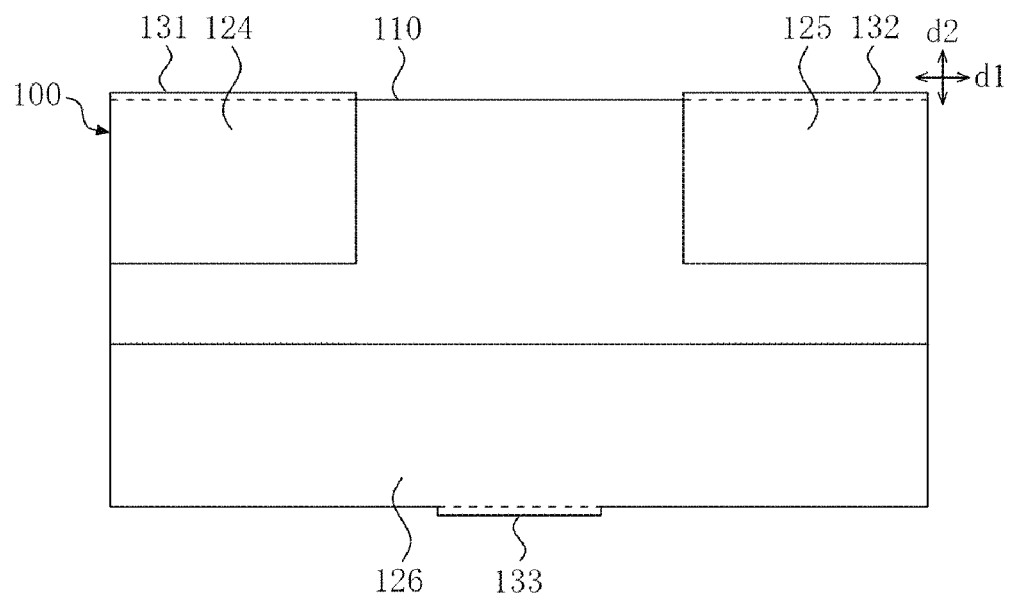
FIG. 3C is a bottom view of the multi-terminal capacitor, showing the surface on the lower side in FIG. 3B.
Figure 3D:
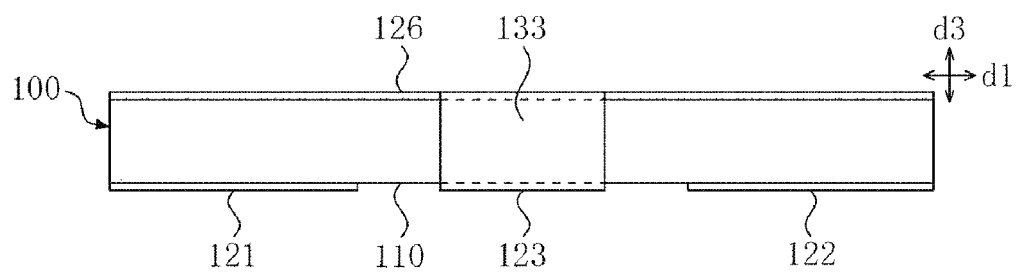
FIG. 3D is a side view of the multi-terminal capacitor, showing the surface on the lower side in FIG. 3C.
Figure 4A:
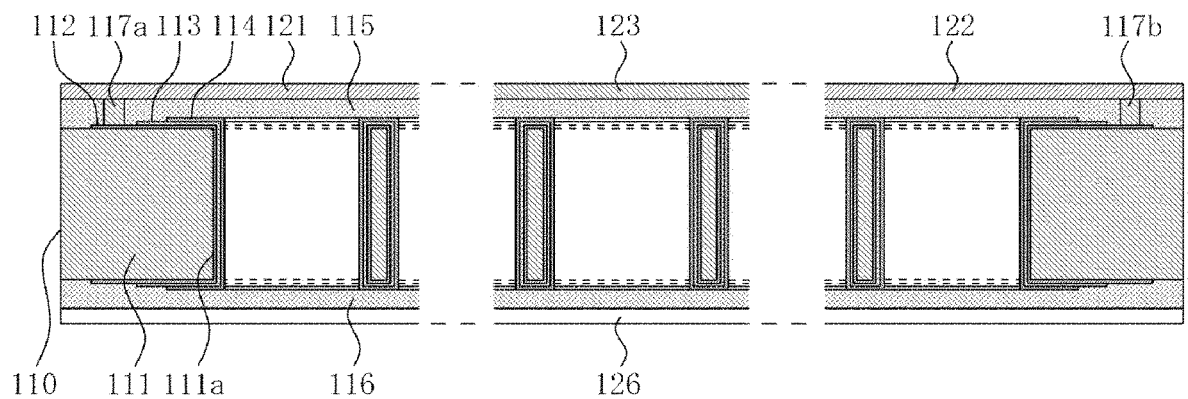
FIG. 4A is an enlarged sectional view showing a section along a line S1-S1 in FIG. 3A, not showing all the components.
Figure 4B:
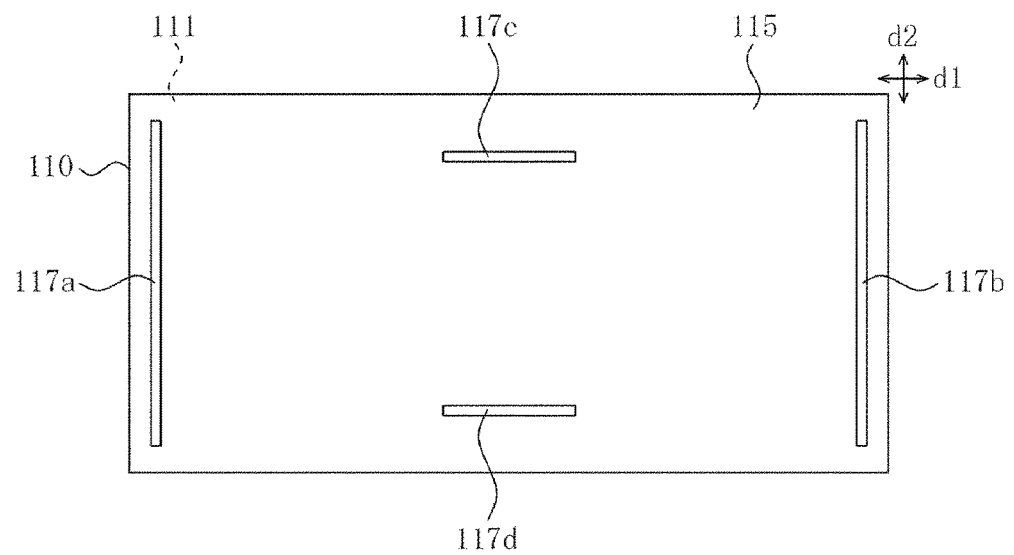
FIG. 4B is a plan view corresponding to FIG. 3A and showing the capacitor body shown in FIGS. 3A to 3D.
Figure 4C:
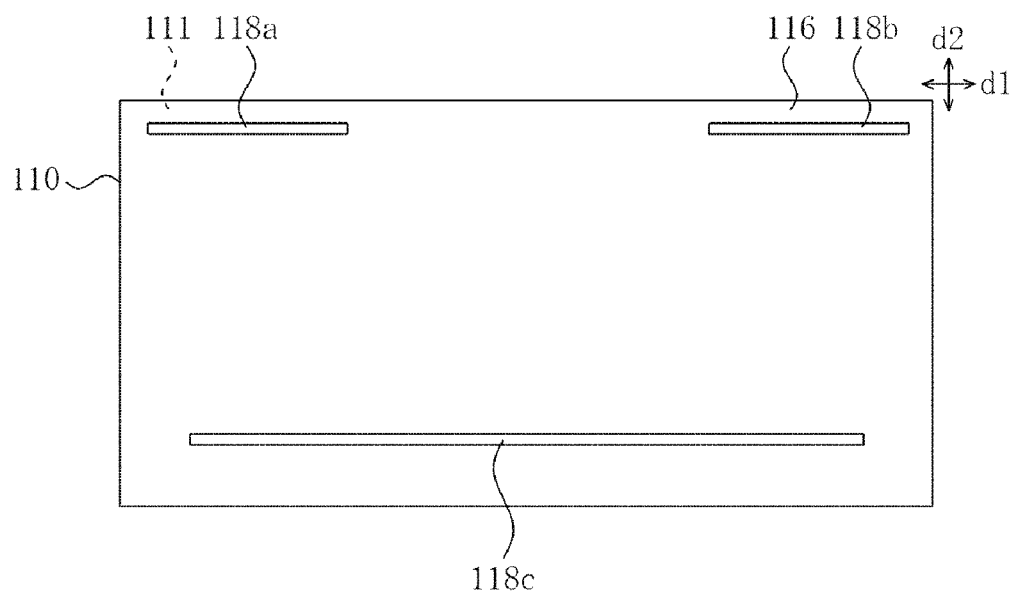
FIG. 4C is a bottom view corresponding to FIG. 3C and showing the capacitor body shown in FIGS. 3A to 3D.

The fifth external terminal 125 is shaped like a rectangle and provided on the other of the surfaces of the capacitor body 110 in the third direction d3 at the one of the edges in the second direction d2 on the other of the sides (the right-side portion of the top edge in FIG. 3C). The first-direction dimension D1 [125] of the fifth external terminal 125 is the same or substantially the same as the first-direction dimension D1 [122] of the second external terminal 122, and its second-direction dimension D2 [125] is less than half the second-direction dimension D2 [110] of the capacitor body 110.

The sixth external terminal 126 is shaped like a rectangle and provided on the other of the surfaces of the capacitor body 110 in the third direction d3 at the other of the edges in the second direction d2 (the bottom edge in FIG. 3C). The first-direction dimension D1 [126] of the sixth external terminal 126 is the same or substantially the same as the first-direction dimension D1 [110] of the capacitor body 110, and its second-direction dimension D2 [126] is less than half the second-direction dimension D2 [110] of the capacitor body 110.

If the multi-terminal capacitor 100 is small and thin, the fourth, fifth and sixth external terminals 124, 125 and 126 are preferably sized such that their first-direction dimensions D1 [124] to [126] and second-direction dimensions D2 [124] to [126] are as large as possible, thereby preventing an increase in connection resistance when the multi-terminal capacitor 100 is mounted on the circuit board 200, which will be described below. The distance between the fourth and fifth external terminals 124 and 125 (the distance in the first direction d1) and the distance between the fourth and fifth external terminals 124 and 125 and the sixth external terminal 126 (the distance in the second direction d2) are preferably 100 μm or more for the purpose of preventing a bonding material, which is used to mount the multi-terminal capacitor 100 onto the circuit board 200, from causing a short circuit. The fourth, fifth and sixth external terminals 124, 125 and 126 can have a thickness of, for example, 5 to 10 μm.

The multi-terminal capacitor 100 is configured such that (i) first, second and third external terminals 121, 122 and 123 provided on one of the surfaces of the capacitor body 110 in the third direction d3 (the top surface in FIG. 3B, see FIG. 3A) allow the capacitance formed by the above-described capacitance forming portion (the reference numeral not identified) to be extracted, and (ii) the fourth, fifth and sixth external terminals 124, 125 and 126 provided on the other of the surfaces of the capacitor body 110 in the third direction d3 (the bottom surface in FIG. 3B, see FIG. 3C) allow the capacitance formed by the above-described capacitance forming portion (the reference numeral not identified) to be extracted.

<Coupling Conductor Portion>

The first to third coupling conductor portions 131 to 133 are described with reference to FIGS. 3A to 3D. The first coupling conductor portion 131 is shaped like a rectangle. One of the edges of the first coupling conductor portion 131 in the third direction d3 (the top edge in FIG. 3B) is continuous from one of the edges of the first external terminal 121 in the second direction d2 (the bottom edge in FIG. 3A), and the other of the edges of the first coupling conductor portion 131 in the third direction d3 (the bottom edge in FIG. 3B) is continuous from one of the edges of the fourth external terminal 124 in the second direction d2 (the top edge in FIG. 3C). The first-direction dimension D1 [131] of the first coupling conductor portion 131 is the same or substantially the same as the first-direction dimension D1 [121] of the first external terminal 121 and the first-direction dimension D1 [124] of the fourth external terminal 124.

The second coupling conductor portion 132 is shaped like a rectangle. One of the edges of the second coupling conductor portion 132 in the third direction d3 (the top edge in FIG. 3B) is continuous from one of the edges of the second external terminal 122 in the second direction d2 (the bottom edge in FIG. 3A), and the other of the edges of the second coupling conductor portion 132 in the third direction d3 (the bottom edge in FIG. 3B) is continuous from one of the edges of the fifth external terminal 125 in the second direction d2 (the top edge in FIG. 3C). The first-direction dimension D1 [132] of the second coupling conductor portion 132 is the same or substantially the same as the first-direction dimension D1 [122] of the second external terminal 122 and the first-direction dimension D1 [125] of the fifth external terminal 125.

The third coupling conductor portion 133 is shaped like a rectangle. One of the edges of the third coupling conductor portion 133 in the third direction d3 (the bottom edge in FIG. 3D) is continuous from one of the edges of the third external terminal 123 in the second direction d2 (the top edge in FIG. 3A), and the other of the edges of the third coupling conductor portion 133 in the third direction d3 (the top edge in FIG. 3D) is continuous from the middle in the first direction d1 of one of the edges of the sixth external terminal 123 in the second direction d2 (the middle in the left-right direction of the bottom edge in FIG. 3C). The first-direction dimension D1 [133] of the third coupling conductor portion 133 is the same or substantially the same as the first-direction dimension D1 [123] of the third external terminal 123.

If the multi-terminal capacitor 100 is small and thin, the first coupling conductor portion 131 is preferably sized such that its first-direction dimension D1 [131] is as large as possible, thereby preventing an increase in coupling resistance between the first external terminal 121 and the fourth external terminal 124, the second coupling conductor portion 132 is preferably sized such that its first-direction dimension D1 [132] is as large as possible, thereby preventing an increase in coupling resistance between the second external terminal 122 and the fifth external terminal 125, and the third coupling conductor portion 133 is preferably sized such that its first-direction dimension D1 [133] is as large as possible, thereby preventing an increase in coupling resistance between the third external terminal 123 and the sixth external terminal 126. The first, second and third coupling conductor portions 131, 132 and 133 can have a thickness of, for example, 5 to 10 μm.

The first coupling conductor portion 131 couples together the first external terminal 121, which is provided on one of the surfaces of the capacitor body 110 in the third direction d3 (the top surface in FIG. 3B, see FIG. 3A), and the fourth external terminal 124, which is provided on the other of the surfaces of the capacitor body 110 in the third direction d3 (the bottom surface in FIG. 3B, see FIG. 3C). The second coupling conductor portion 132 couples together the second external terminal 122, which is provided on one of the surfaces of the capacitor body 110 in the third direction d3 (the top surface in FIG. 3B, see FIG. 3A), and the fifth external terminal 125, which is provided on the other of the surfaces of the capacitor body 110 in the third direction d3 (the bottom surface in FIG. 3B, see FIG. 3C). The third coupling conductor portion 133 couples together the third external terminal 123, which is provided on one of the surfaces of the capacitor body 110 in the third direction d3 (the top surface in FIG. 3B, see FIG. 3A), and the sixth external terminal 125, which is provided on the other of the surfaces of the capacitor body 110 in the third direction d3 (the bottom surface in FIG. 3B, see FIG. 3C). These couplings can prevent, to a maximum extent, a difference in capacitance from arising between (i) when the capacitance formed by the above-described capacitance forming portion (the reference numeral not identified) is extracted by the first, second and third external terminals 121, 122 and 123 and (ii) when the capacitance formed by the above-described capacitance forming portion (the reference numeral not identified) is extracted by the fourth, fifth and sixth external terminals 124, 125 and 126.

The following now describes a method of manufacturing the multi-terminal capacitor 100 with reference to FIGS. 6A to 11B. Although FIGS. 6A to 11B illustrate a single multi-terminal capacitor 100, in reality, a large number of multi-terminal capacitors 100 are obtained through a step of dividing into a desired size following a connecting conductor portion making step, which will be described below.

The method of manufacturing the multi-terminal capacitor 100 includes a substrate portion making step, a capacitance forming portion making step, a protective film making step, a connecting conductor portion making step, and an external terminal making step (including a coupling conductor making step).

<Substrate Portion Making Step>

Figure 5C:
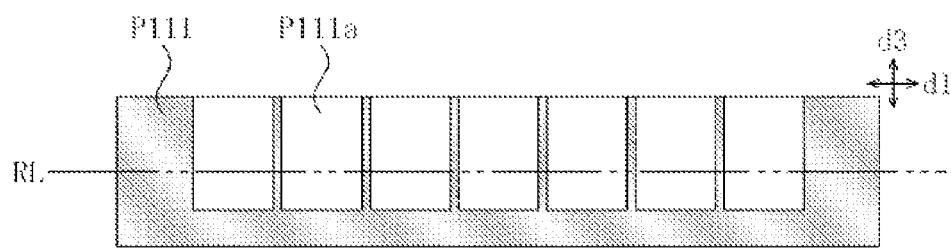
FIG. 5C illustrates a substrate portion making step.

The step of making the substrate portion 111 involves, as illustrated in FIGS. 5A to 5C, preparing a base material P111 having a larger thickness than the substrate portion 111, forming an etching mask (not shown) corresponding to the through holes 111a on one of the surfaces of the base material P111 in the third direction d3 (the top surface in FIG. 5C), performing etching using the etching mask to form deep grooves P111a in the base material P111, and then removing the etching mask and removing a part (the portion lower than the line RL in FIG. 5C) of the other of the surfaces of the base material P111 in the third direction d3 through grinding or the like. As a result of these steps, the substrate portion 111 shown as an example in FIGS. 5A and 5B is obtained.

The base material P111 can be made of any of known semiconductor or dielectric materials such as silicon, silicon oxide, and aluminum oxide. Among these options, silicon, in other words, a silicon wafer is suitably used as the base material P111. The etching can be selected from the options including the known dry and wet etching techniques. Among these options, reactive ion etching (RIE), more particularly, deep reactive ion etching (DRIE) such as the Bosch process is preferably employed.

<Capacitance Forming Portion Making Step>

Figure 6A:
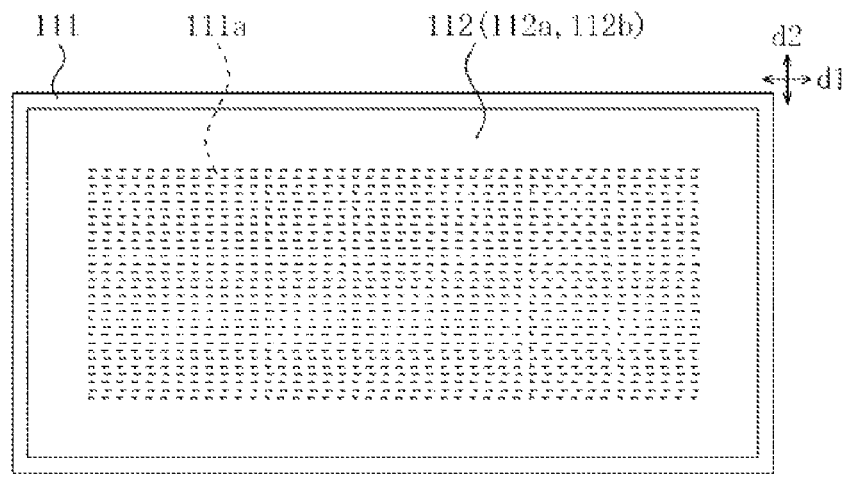
FIGS. 6A and 6B illustrate a capacitance forming portion making step (a first conductor film making step).
Figure 6B:
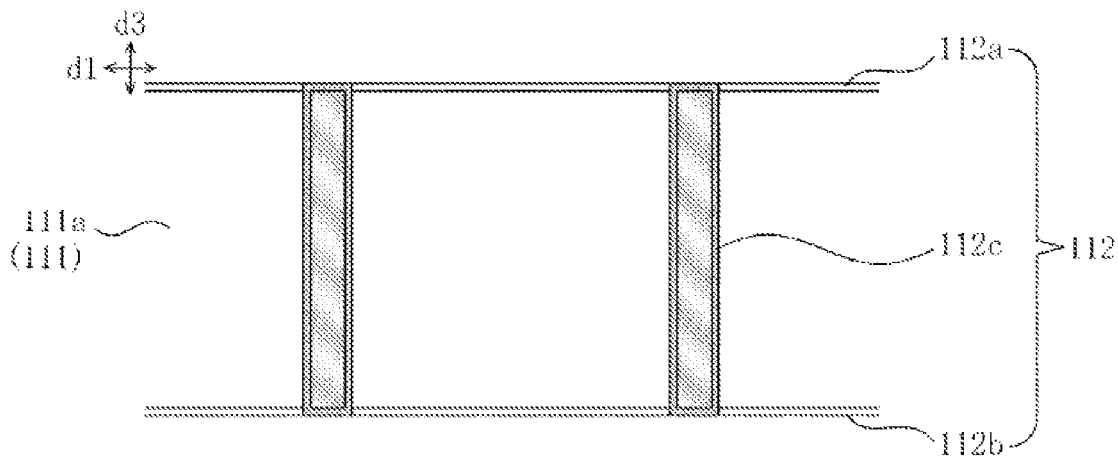
Figure 7A:
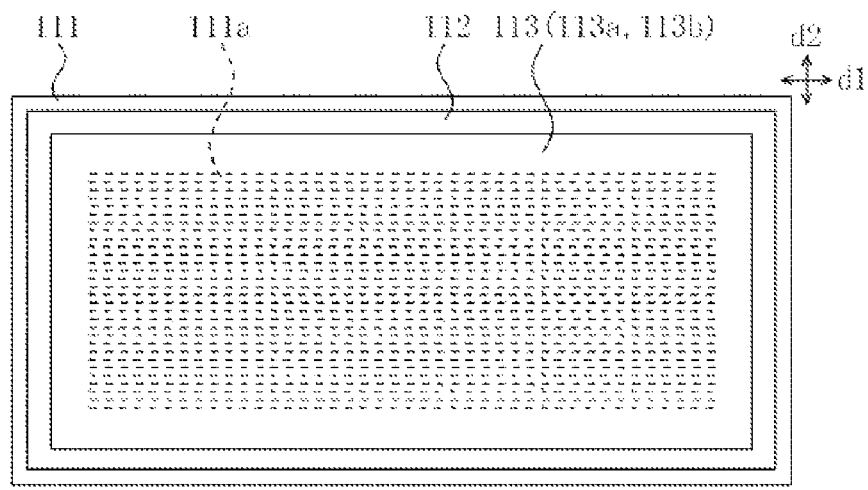
FIGS. 7A and 7B illustrate the capacitance forming portion making step (a dielectric film making step).
Figure 7B:
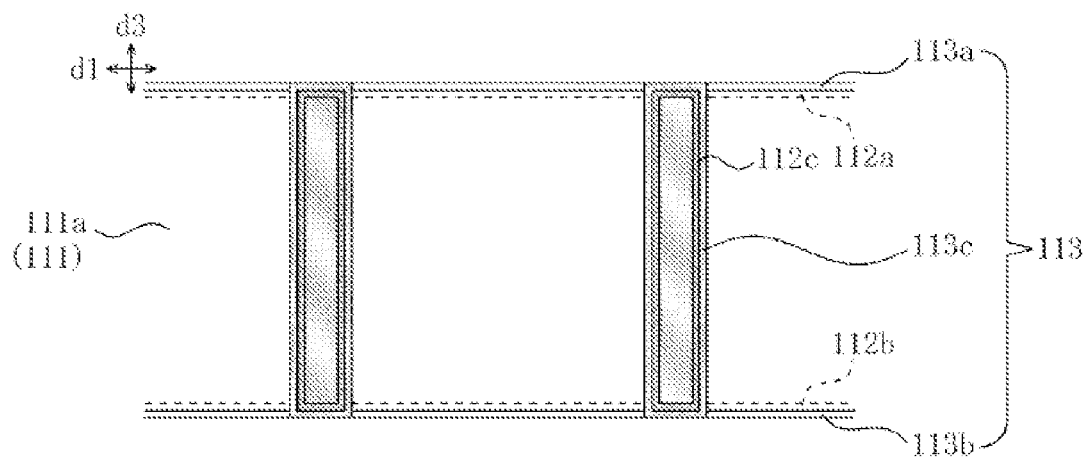
Figure 8A:
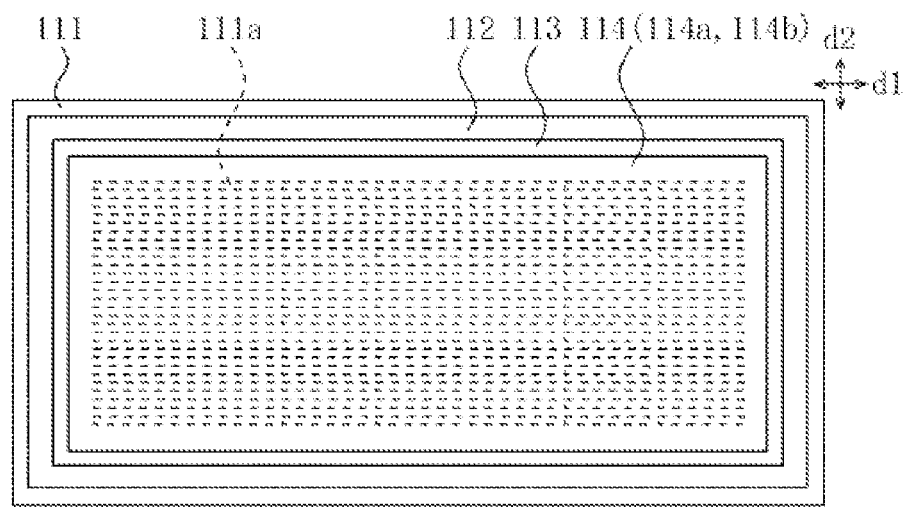
FIGS. 8A and 8B illustrate the capacitance forming portion making step (a second conductor film making step).
Figure 8B:
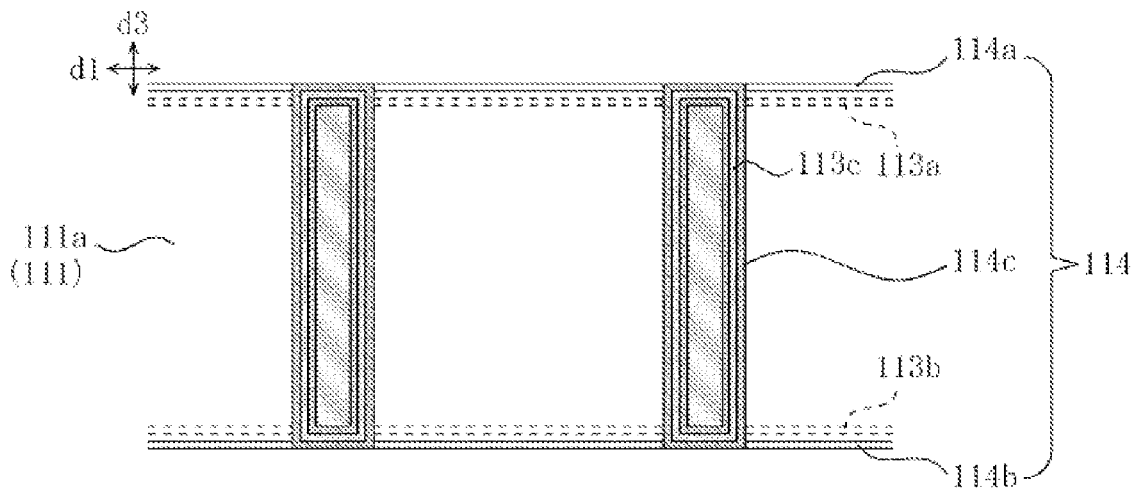

The step of making the capacitance forming portion (the reference numeral not identified) involves, as shown in FIGS. 6A and 6B, a step of making the first conductor film 112 integrally including the first planar portion 112a covering one of the surfaces of the substrate portion 111 in the third direction d3 (the top surface in FIG. 6B), the second planar portion 112b covering the other of the surfaces of the substrate portion 111 in the third direction d3 (the bottom surface in FIG. 6B) and the tubular portions 112c covering the inner wall of the through holes 111a in the substrate portion 111, (2), as shown in FIGS. 7A and 7B, a step of making the dielectric film 113 integrally including the first planar portion 113a covering the first planar portion 112a of the first conductor film 112, the second planar portion 113b covering the second planar portion 112b of the first conductor film 112, and the tubular portions 113c covering the inner surface of the tubular portions 112c in the first conductor film 112, and (3), as shown in FIGS. 8A and 8C, a step of making the second conductor film 114 integrally including the first planar portion 114a covering the first planar portion 113a of the dielectric film 113, the second planar portion 114b covering the second planar portion 113b of the dielectric film 113, and the tubular portions 114c covering the inner surface of the tubular portions 113c in the dielectric film 113.

The first and second conductor films 112 and 114 are made of any of known conductive materials including metals such as nickel, copper, palladium, platinum, silver, gold, ruthenium, tungsten, molybdenum, titanium, or alloys thereof and electrically conductive materials such as conductive silicone. Among these options, titanium (titanium nitride) is preferably used. The first and second conductor films 112 and 114 and dielectric film 113 are made using any of known techniques including dry and wet plating, for example, sputtering, evaporation, CVD including atomic layer deposition (ALD), electroplating, and electroless deposition. Among these options, atomic layer deposition (ALD) is preferably used.

<Protective Film Making Step>

The step of making the first and second protective films 115 and 116 includes, as shown in FIGS. 9A and 9B, (1) a step of making the first protective film 115 covering the first planar portions 112a, 113a and 114a of the first conductor film 112, the dielectric film 113 and the second conductor film 114 on one of the surfaces of the substrate portion 111 in the third direction d3 (the top surface in FIG. 9B), and (2) a step of making the second protective film 116 covering the second planar portions 112b, 113b and 114b of the first conductor film 112, the dielectric film 113 and the second conductor film 114 on the other of the surfaces of the substrate portion 111 in the third direction d3 (the bottom surface in FIG. 9B).

The first and second protective films 115 and 116 are made of any of known dielectric materials such as polyimide, silicon oxide, silicon nitride, silicon oxynitride or the like. Among these options, silicon nitride is preferably used. The first and second protective films 115 and 116 can be made using any of known film forming techniques such as spin-coating, spray-coating, and printing. Among these options, spin-coating is preferably used.

Here, a barrier film may be made between (i) the above-described capacitance forming portion (the reference numeral not identified) and (ii) each of the protective films 115 and 116 in order to prevent water and hydrogen from entering the capacitance forming portion. The barrier film may have a thickness of, for example, 5 to 500 nm, can be made of any of known dielectric materials such as alumina, zirconia, silicon oxide, and silicon oxynitride, and can be made using any of methods such as sputtering and CVD.

<Connecting Conductor Portion Making Step>

Figure 10D:
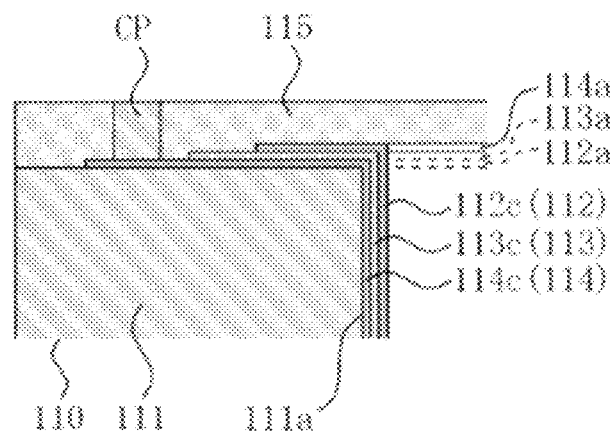

To make the first to fourth connecting conductor portions 117a to 117d and the fifth to seventh connecting conductor portions 118a to 118c, as illustrated in FIGS. 10A to 10D, an etching mask (not shown) corresponding to the first to fourth connecting conductor portions 117a to 117d is formed on one of the surfaces of the first protective film 115 in the third direction d3 (the top surface in FIG. 10D), etching is performed on the first protective film 115 with the use of the etching mask to form through holes TH in the first protective film 15 (see FIG. 10C), the etching mask is then removed, and conductor portions CP are made in the through holes TH (see FIG. 10D). Similarly, an etching mask (not shown) corresponding to the fifth to seventh connecting conductor portions 118a to 118c is formed on one of the surfaces of the second protective film 116 in the third direction d3 (the surface shown in FIG. 10B), etching is performed on the second protective film 116 with the use of the etching mask to form through holes TH (not shown), the etching mask is then removed, and conductor portions CP (not shown) are made in the through holes TH.

The etching can be selected from the options including the known dry and wet etching techniques. Among these options, dry etching is preferably employed. The conductor portions CP are made of any of known conductive materials including metals such as copper, nickel, tin, palladium, platinum, gold, or alloys thereof. Among these options, nickel is preferably used. The conductor portions CP are made using any one of known techniques including dry and wet plating, for example, sputtering, evaporation, electroplating, and electroless deposition. Among these options, electroless deposition is preferably used.

<External Terminal Making Step (Including Coupling Conductor Making Step)>

Figure 11A:
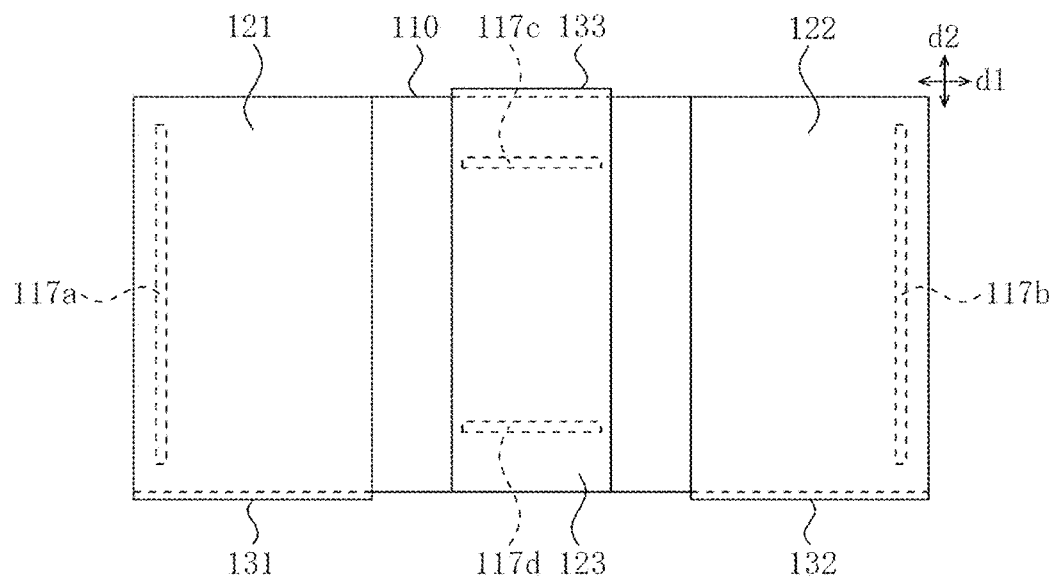
FIGS. 11A and 11B illustrate an external terminal making step (including a coupling conductor portion making step).
Figure 11B:
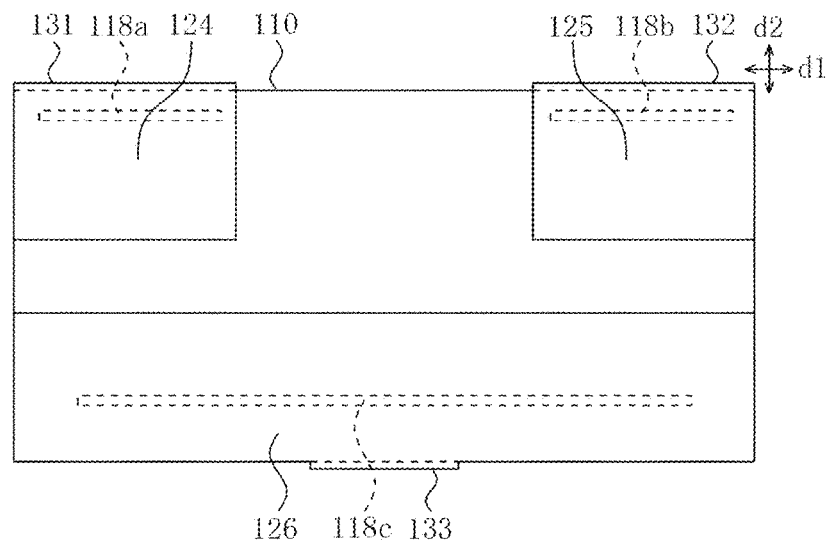

The external terminal making step (including a coupling conductor making step) is differently performed between when the first to sixth external terminals 121 to 122 and the first to third coupling conductor portions 131 to 133 are made up by a single film and when they are made up by a plurality of films. In a case where these are made up by a single film, as shown in FIGS. 11A and 11B, a plating mask is formed on a part of the entire surface of the capacitor body 110, more particularly on a portion where the first to sixth external terminals 121 to 126 and the first to third coupling conductor portions 131 to 133 are not made, plating is performed with the use of the plating mask to form the first to sixth external terminals 121 to 126 and the first to third coupling conductor portions 131 to 133, and the plating mask is then removed.

The single film is made of any of known conductive materials including metals such as titanium, copper, nickel, silver, gold, platinum, palladium, tin, chromium, titanium, tantalum, tungsten, molybdenum, or alloys thereof. Among these options, titanium or nickel is preferably used. The single film is made using any one of known dry plating techniques such as sputtering, evaporation and CVD. Among these options, sputtering is preferably used. Alternatively, the single film can be made using a known baking technique, more specifically, by applying a conductive paste using a roller or via printing and baking the applied conductive paste.

In a case where the first to sixth external terminals 121 to 126 and the first to third coupling conductor portions 131 to 133 are made up by a plurality of films, the above-mentioned single film is treated as an underlying film, a second film is made on the surface of the underlying film, a third film is made on the surface of the second film, and a fourth film is made on the surface of the third film, as required.

The second and subsequent films can be made of the same material as the above-mentioned single film, but may be made of different materials than the signal film considering the adhesion between the films. In an example case where there are four films, the first film (the above-mentioned single film) is made of titanium, the second film is made of nickel, the third film is made of copper and the fourth film is made of tin, or the first film (the above-mentioned single film) is made of nickel, the second film is made of coper, the third film is made of nickel and the fourth film is made of tin. Other combinations can be also applicable. The second and subsequent films are made using any one of known wet plating techniques including, for example, electroplating and electroless deposition. Among these options, electroplating is preferably used. Alternatively, the second and subsequent films can be made using a known baking technique, more specifically, by applying a conductive paste using a roller or via printing and baking the applied conductive paste.

The following now describes a case where the multi-terminal capacitor 100 is mounted on a circuit board as a feedthrough capacitor and a case where the multi-terminal capacitor 100 is mounted on a circuit board as a LW reversal capacitor with reference to FIGS. 12A to 13D.

Figure 12A:
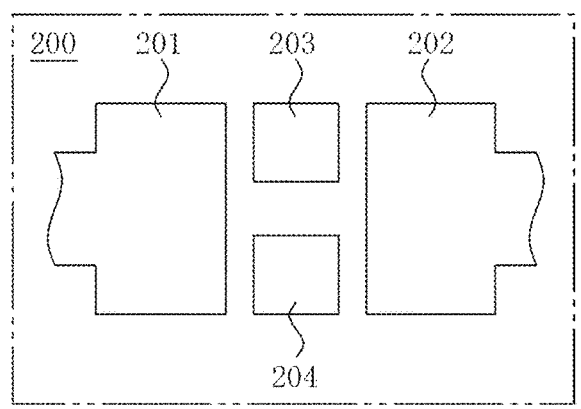
FIG. 12A shows pads used to mount, onto a circuit board, the multi-terminal capacitor shown in FIGS. 3A to 3D as a feedthrough capacitor.
Figure 12B:
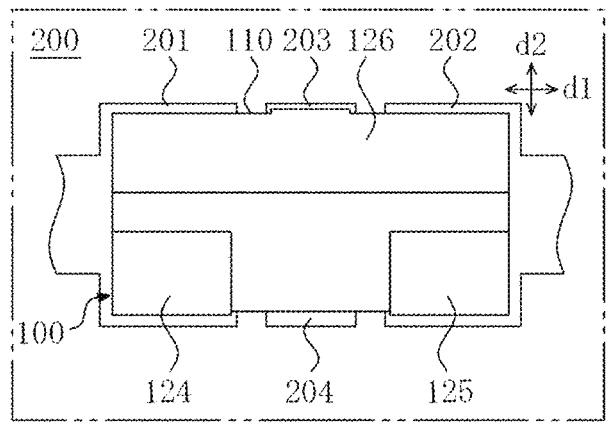
FIG. 12B shows how the multi-terminal capacitor is mounted on the circuit board.
Figure 12C:
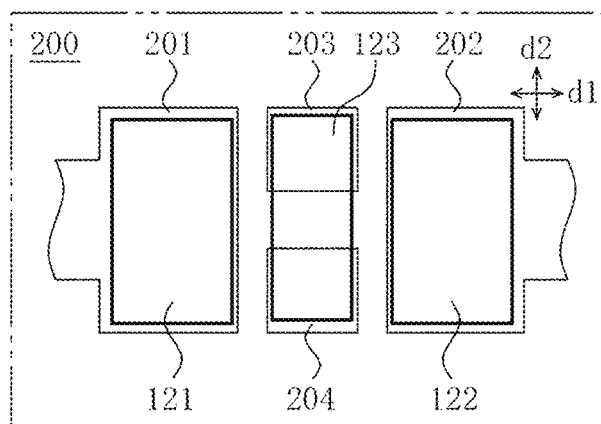
FIG. 12C illustrates how connections are done to mount the multi-terminal capacitor onto the circuit board.
Figure 12D:
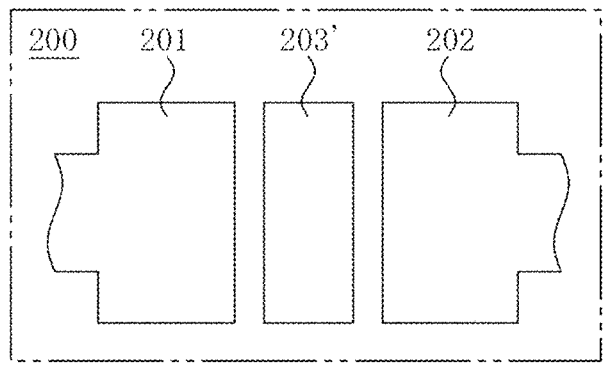
FIG. 12D shows a modification example of the pads shown in FIG. 12A.

FIG. 12A shows example pads used to mount the multi-terminal capacitor 100 onto the circuit board 200 as a feedthrough capacitor. In FIG. 12A, the reference numerals 201 and 202 indicate signal pads, and the reference numerals 203 and 204 indicate ground pads. FIGS. 12B and 12C show a case where the multi-terminal capacitor 100 is mounted on the circuit board 200 as a feedthrough capacitor and how connections are done. The multi-terminal capacitor 100 is connected such that the first external terminal 121 is connected to the signal pad 201 using a bonding member such as a solder (not shown), the second external terminal 122 is connected to the signal pad 202 using the same bonding member, and the third external terminal 123 is connected to the ground pads 203 and 204 using the same bonding member. FIG. 12D shows example pads that can replace the pads shown in FIG. 12A. In the example shown in FIG. 12D, a single ground pad 203' replaces the two ground pads 203 and 204.

Figure 13A:
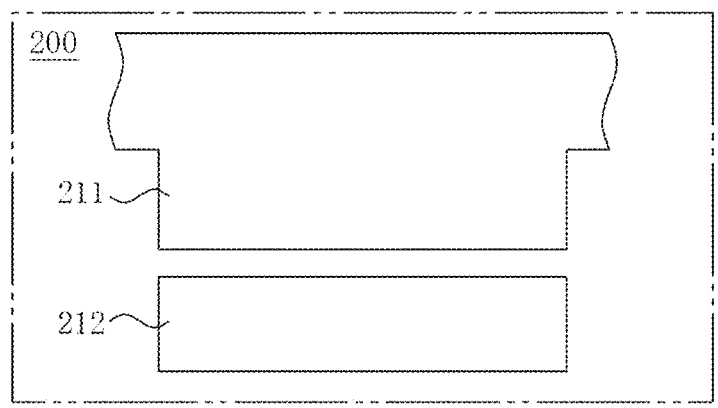
FIG. 13A shows pads used to mount, onto a circuit board, the multi-terminal capacitor shown in FIGS. 3A to 3D as a LW reversal capacitor.
Figure 13B:
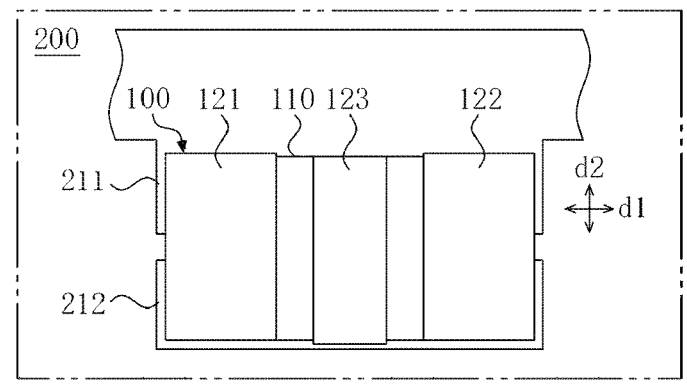
FIG. 13B shows how the multi-terminal capacitor is mounted on the circuit board.
Figure 13C:
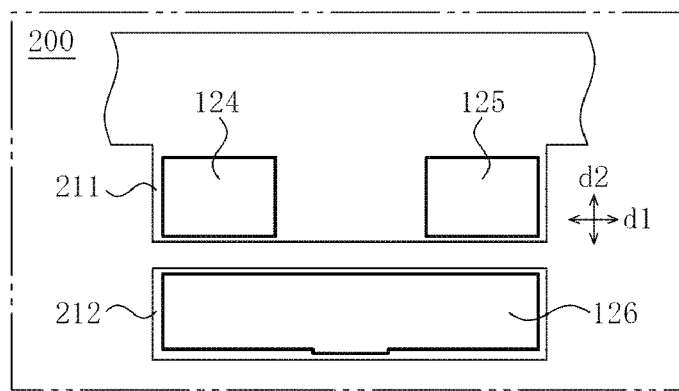
FIG. 13C illustrates how connections are done to mount the multi-terminal capacitor onto the circuit board.
Figure 13D:
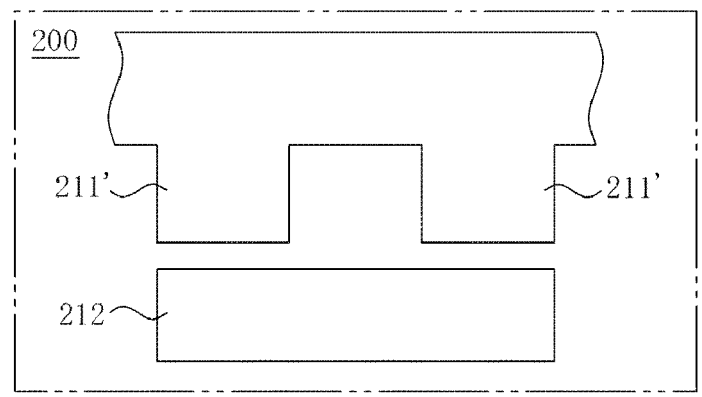
FIG. 13D shows a modification example of the pads shown in FIG. 13A.

FIG. 13A shows example pads used to mount the multi-terminal capacitor 100 onto the circuit board 200 as a LW reversal capacitor. In FIG. 13A, the reference numeral 211 indicates a signal pad, and the reference numeral 212 indicates a ground pad. FIGS. 13B and 13C show a case where the multi-terminal capacitor 100 is mounted on the circuit board 200 as a LW reversal capacitor and how connections are done. The multi-terminal capacitor 100 is connected such that the fourth and fifth external terminals 124 and 125 are connected to the signal pad 211 using a bonding member such as a solder (not shown), and the sixth external terminal 126 is connected to the ground pad 212 using the same bonding member. FIG. 13D shows example pads that can replace the pads shown in FIG. 13A. In the example shown in FIG. 13D, the single signal pad 211 is divided into two signal pads 211' to deal with the fourth and fifth external terminals 124 and 125 of the multi-terminal capacitor 100.

As described above, the multi-terminal capacitor 100 is configured such that the first, second and third external terminals 121, 122 and 123 provided on one of the surfaces of the capacitor body 110 in the third direction d3 (the top surface in FIG. 3B, see FIG. 3A) allow the capacitance formed by the above-described capacitance forming portion (the reference numeral not identified) to be extracted, and the fourth, fifth and sixth external terminals 124, 125 and 126 provided on the other of the surfaces of the capacitor body 110 in the third direction d3 (the bottom surface in FIG. 3B, see FIG. 3C) allow the capacitance formed by the above-described capacitance forming portion (the reference numeral not identified) to be extracted. With such a design, the same capacitance can be obtained irrespective of whether the single multiple-terminal capacitor 100 is mounted on the circuit board 200 as a feedthrough capacitor (see FIGS. 12B and 12C) or as the LW reversal capacitor (see FIGS. 13B and 13C).

With the above-described configuration, multi-terminal capacitors 100 of the single size can be used either as the feedthrough capacitors or as the LW reversal capacitors. This eliminates the need of separately preparing feedthrough and LW reversal capacitors of the same size and capacitance, which is required in the conventional art in a case where both types are used. Additionally, in a case where two or more types of capacitors may need to be prepared and capacitors of each type may need to have the same size and capacitance, for each type, feedthrough and LW reversal capacitors do not need to be separately prepared.

A large number of capacitors may be mounted on a circuit board for the purposes of removing noise and reducing voltage variation. In this case, feedthrough and LW reversal capacitors need to be prepared separately despite that they both have the same size and capacitance, and feedthrough and LW reversal capacitors of two or more types may need to be separately prepared. According to the present invention, necessary capacitors can be halved in terms of the types, thereby facilitating the storage and management of the capacitors. In addition, this can contribute to reduction in cost of producing electronic-component-mounted circuit boards including the multi-terminal capacitor 100.

The following describes modification examples of the multi-terminal capacitor 100 described above.

(1) In the above-described embodiment, a single first conductor film 112, a single dielectric film 113 and a single second conductor film 114 are used. A dielectric film covering the second conductor film and a third conductor film covering the dielectric film may be additionally provided and can be used to constitute a capacitance forming portion (the reference numeral not identified). Furthermore, a dielectric film covering the third conductor film and a fourth conductor film covering the dielectric film may be additionally provided and can be used to constitute a capacitance forming portion (the reference numeral not identified).

(M2) According to the above-described embodiment, the first to third coupling conductor portions 131 to 133 are provided. It is, however, still possible to configure the multi-terminal capacitor 100 such that the same capacitance can be extracted by the first, second and third external terminals 121, 122 and 123, and by the fourth, fifth and sixth external terminals 124, 125 and 126, without the first to third coupling conductor portions 131 to 133.

Figure 14:
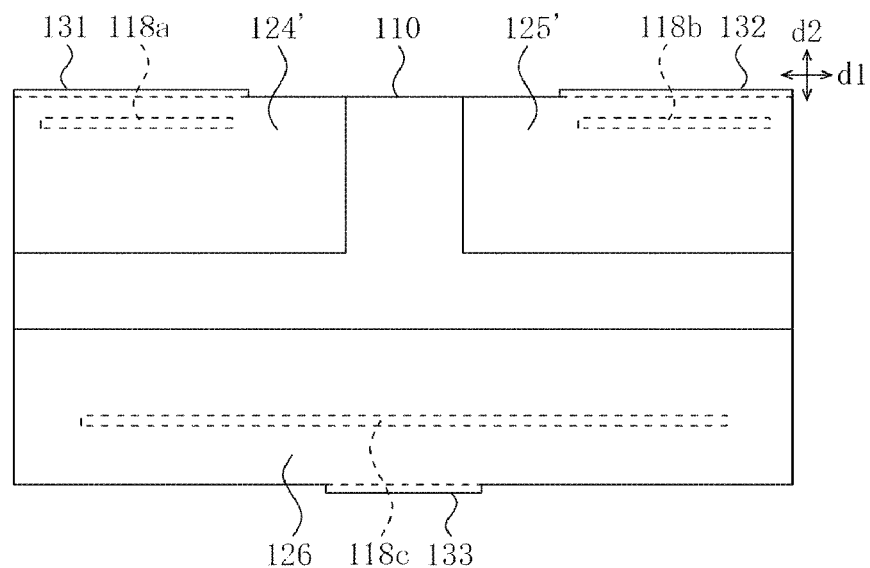
FIG. 14 corresponds to FIG. 3C and shows a modification example of fourth and fifth external terminals of the multi-terminal capacitor shown in FIGS. 3A to 3D.

(M3) According to the above-described embodiment, the first-direction dimension D1 [121] of the first external terminal 121 is the same or substantially the same as the first-direction dimension D1 [124] of the fourth external terminal 124, and the first-direction dimension D1 [122] of the second external terminal 122 is the same or substantially the same as the first-direction dimension D1 [125] of the fifth external terminal 125. As illustrated in FIG. 14, however, the first-direction dimension D1 [124'] of the fourth external terminal 124' may be greater than the first-direction dimension D1 [121] of the first external terminal 121, and the first-direction dimension D1 [125'] of the fifth external terminal 125' may be greater than the first-direction dimension D1 [122] of the second external terminal 122, so that the fourth and fifth external terminals 124' and 125' may achieve increased mounted (connected) area.

Figure 15:
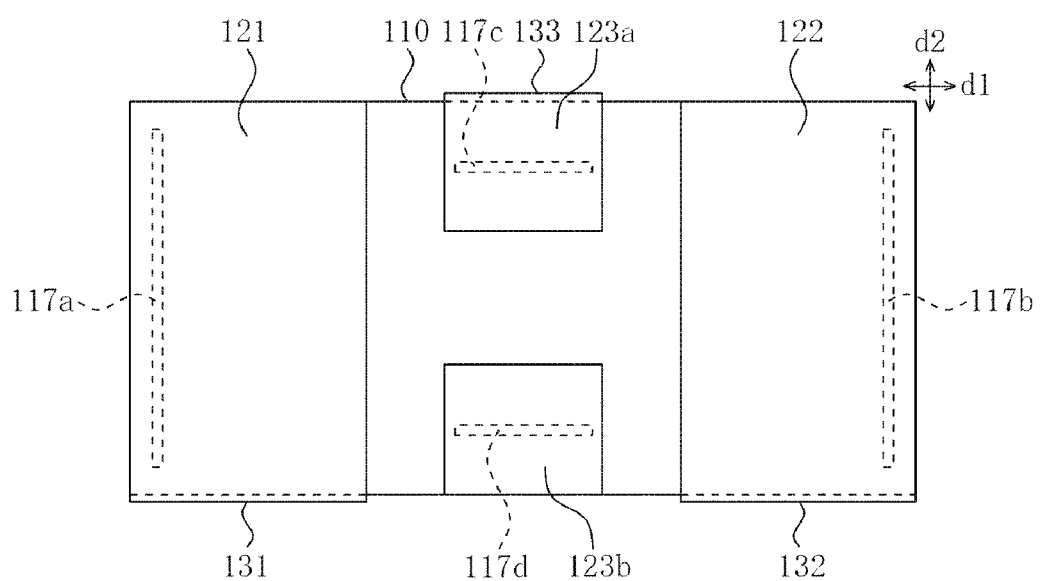
FIG. 15 corresponds to FIG. 3A and shows a modification example of a third external terminal of the multi-terminal capacitor shown in FIGS. 3A to 3D.

(M4) According to the above-described embodiment, the third external terminal 123 is connected to the third and fourth connecting conductor portions 117c and 117d. As illustrated in FIG. 15, however, the third external terminal 123 may be divided into a first separate portion 123a and a second separate portion 123b spaced away from the first separate portion 123a in the second direction d2, the first separate portion 123a may be connected to the third connecting conductor portion 117c, and the second separate portion 123b may be connected to the fourth connecting conductor portion 117d. In this case, it may be only required that the first separate portion 123a be coupled with the sixth external terminal 126 through the third coupling conductor portion 133.

LIST OF REFERENCE NUMBERS

100 . . . Multi-terminal capacitor, 110 . . . capacitor body, 111 . . . substrate portion, 111a . . . through hole, 112 . . . first conductor film, 112a . . . first planar portion, 112b . . . second planar portion, 112c . . . tubular portion, 113 . . . dielectric film, 113a . . . first planar portion, 113b . . . second planar portion, 113c . . . tubular portion, 114 . . . second conductor film, 114a . . . first planar portion, 114b . . . second planar portion, 114c . . . tubular portion, 115 . . . first protective film, 116 . . . second protective film, 117a . . . first connecting conductor portion, 117b . . . second connecting conductor portion, 117c . . . third connecting conductor portion, 117d . . . fourth connecting conductor portion, 118a . . . fifth connecting conductor portion, 118b . . . sixth connecting conductor portion, 118c . . . seventh connecting conductor portion, 121 . . . first external terminal, 122 . . . second external terminal, 123 . . . third external terminal, 123a . . . first separate portion of third external terminal, 123b . . . second separate portion of third external terminal, 124, 124' . . . fourth external terminal, 125, 125' . . . fifth external terminal, 126 . . . sixth external terminal, 131 . . . first coupling conductor portion, 132 . . . second coupling conductor portion, 133 . . . third coupling conductor portion, 200 . . . circuit board, 201, 202 . . . signal pad, 203, 203', 204 . . . ground pad, 211, 211' . . . signal pad, 212 . . . ground pad

What is claimed is:

1. A multi-terminal capacitor comprising a capacitor body shaped like a rectangular parallelepiped, the capacitor body including a capacitance forming portion configured to form capacitance between a first conductor film and a second conductor film facing each other with a dielectric film being interposed therebetween,
    wherein, when first, second and third directions respectively denotes a direction in which two opposing surfaces of the capacitor body face each other, a direction in which other two opposing surfaces face each other, and a direction in which the remaining two opposing surfaces face each other, first, second and third external terminals are provided on one of surfaces of the capacitor body in the third direction,
    wherein the first and second external terminals are electrically connected to the first conductor film,
    wherein the third external terminal is electrically connected to the second conductor film,
    wherein fourth, fifth and sixth external terminals are provided on the other of the surfaces of the capacitor body in the third direction,
    wherein the fourth and fifth external terminals are electrically connected to the first conductor film,
    wherein the sixth external terminal is electrically connected to the second conductor film,
    wherein the first, second and third external terminals are configured such that the capacitance formed by the capacitance forming portion is extracted by the first, second and third external terminals,
    wherein the fourth, fifth and sixth external terminals are configured such that the capacitance formed by the capacitance forming portion is extracted by the fourth, fifth and sixth external terminals,
    wherein, on one of the surfaces of the capacitor body in the third direction, the first external terminal is provided on one of edges of the capacitor body in the first direction, the second external terminal is provided on the other of the edges of the capacitor body in the first direction and positioned away in the first direction from the first external terminal, and the third external terminal is interposed between the first and second external terminals and in contact with neither the first nor second external terminal, and
    wherein, on the other of the surfaces of the capacitor body in the third direction, the fourth and fifth external terminals are provided on one of edges of the capacitor body in the second direction and positioned at respective sides thereof such that the fourth and fifth external terminals are spaced away from each other in the first direction, the sixth external terminal is provided on the other of the edges of the capacitor body in the second direction and spaced away from the fourth and fifth external terminals in the second direction.

2. The multi-terminal capacitor of claim 1,
    wherein the first external terminal is connected to one of edges of the first conductor film in the first direction via a first connecting conductor portion provided on the capacitor body,
    wherein the second external terminal is connected to the other of the edges of the first conductor film in the first direction via a second connecting conductor portion provided on the capacitor body,
    wherein the third external terminal is connected to edges of the second conductor film in the second direction via third and fourth connecting conductor portions provided on the capacitor body,
    wherein the fourth external terminal is connected to one of edges of the first conductor film in the second direction at one side via a fifth connecting conductor portion provided on the capacitor body,
    wherein the fifth external terminal is connected to the one of the edges of the first conductor film in the second direction at the other side via a sixth connecting conductor portion provided on the capacitor body, and
    wherein the sixth external terminal is connected to one of the edges of the second conductor film in the second direction via a seventh connecting conductor portion provided on the capacitor body.

3. The multi-terminal capacitor of claim 2,
    wherein the third external terminal is constituted by a first separate portion and a second separate portion spaced away from the first separate portion in the second direction, and
    wherein the first separate portion is connected to one of edges of the second conductor film in the second direction via the third connecting conductor portion, and the second separate portion is connected to the other of the edges of the second conductor film in the second direction via the fourth connecting conductor portion.

4. The multi-terminal capacitor of claim 1,
wherein the first and fourth external terminals are coupled together via a first coupling conductor portion,
wherein the second and fifth external terminals are coupled together via a second coupling conductor portion, and
wherein the third and sixth external terminals are coupled together via a third coupling conductor portion.

5. The multi-terminal capacitor of claim 4,
wherein the third external terminal is constituted by a first separate portion and a second separate portion spaced away from the first separate portion in the second direction, and
wherein the first separate portion is coupled to the sixth external terminal via the third coupling conductor portion.

6. The multi-terminal capacitor of claim 1,
wherein the capacitor body includes a substrate portion shaped like a rectangular parallelepiped and having a plurality of through holes formed therein,
wherein the first conductor film continuously covers surfaces of the substrate portion in the third direction and an inner wall of the through holes,
wherein the dielectric film covers the first conductor film, and
wherein the second conductor film covers the dielectric film.

7. The multi-terminal capacitor of claim 6, wherein the capacitance forming portion is configured such that the capacitance is constituted by (i) partial capacitance formed by first planar portions of the first conductor film, the dielectric film and the second conductor film provided on one of surfaces of the substrate portion in the third direction, (ii) partial capacitance formed by second planar portions of the first conductor film, the dielectric film and a third conductor film provided on the other of the surfaces of the substrate portion in the third direction, and (iii) partial capacitance formed by tubular portions of the first conductor film, the dielectric film and the second conductor film provided in the through holes in the substrate portion.

8. The multi-terminal capacitor of claim 6, wherein the capacitor body includes:
a first protective film covering first planar portions of the first conductor film, the dielectric film and the second conductor film provided on one of surfaces of the substrate portion in the third direction; and
a second protective film covering second planar portions of the first conductor film, the dielectric film and the second conductor film on the other of the surfaces of the substrate portion in the third direction.

9. The multi-terminal capacitor of claim 1, wherein when a first-direction dimension, a second-direction dimension, and a third-direction dimension respectively denote a dimension in the first direction, a dimension in the second direction and a dimension in the third direction, a first-direction dimension of the capacitor body is greater than a second-direction dimension of the capacitor body.

10. The multi-terminal capacitor of claim 9, wherein a third-direction dimension of the capacitor body is less than a second-direction dimension of the capacitor body.

11. The multi-terminal capacitor of claim 10, wherein a second-direction dimension of the capacitor body is 100 μm or less.

12. The multi-terminal capacitor of claim 10, wherein a second-direction dimension of the capacitor body is 50 μm or less.

13. A multi-terminal-capacitor-mounted circuit board comprising:
a circuit board; and
the multi-terminal capacitor of claim 1 mounted on the circuit board using the first, second and third external terminals.

14. A multi-terminal-capacitor-mounted circuit board comprising:
a circuit board; and
the multi-terminal capacitor of claim 1 mounted on the circuit board using the fourth, fifth and sixth external terminals.

15. A method of manufacturing a multi-terminal capacitor, the method comprising steps of:
making a capacitor body shaped like a rectangular parallelepiped, the capacitor body including a capacitance forming portion configured to form capacitance between a first conductor film and a second conductor film facing each other with a dielectric film being interposed therebetween; and
making (i) first, second and third external terminals such that the capacitance formed by the capacitance forming portion is extracted by the first, second and third external terminals and (ii) fourth, fifth and sixth external terminals such that the capacitance formed by the capacitance forming portion is extracted by the fourth, fifth and sixth external terminals, when first, second and third directions respectively denote a direction in which two opposing surfaces of the capacitor body face each other, a direction in which other two opposing surfaces face each other, and a direction in which the remaining two opposing surfaces face each other, the first, second and third external terminals being provided on one of surfaces of the capacitor body in the third direction, the first and second external terminals being electrically connected to the first conductor film, the third external terminal being electrically connected to the second conductor film, the fourth, fifth and sixth external terminals being provided on the other of the surfaces of the capacitor body in the third direction, the fourth and fifth external terminals being electrically connected to the first conductor film, the sixth external terminal being electrically connected to the second conductor film,
wherein the making comprises, on one of the surfaces of the capacitor body in the third direction, providing the first external terminal on one of edges of the capacitor body in the first direction, providing the second external terminal on the other of the edges of the capacitor body in the first direction and positioned away in the first direction from the first external terminal, and interposing the third external terminal between the first and second external terminals and in contact with neither the first nor second external terminal, and
on the other of the surfaces of the capacitor body in the third direction, providing the fourth and fifth external terminals on one of edges of the capacitor body in the second direction and positioned at respective sides thereof such that the fourth and fifth external terminals are spaced away from each other in the first direction, and providing the sixth external terminal on the other of the edges of the capacitor body in the second direction and spaced away from the fourth and fifth external terminals in the second direction.

16. The method of claim 15, wherein the step of making the external terminals includes a step of making first, second and third coupling conductor portions, the first coupling conductor portion coupling the first and fourth external terminals, the second coupling conductor portion being configured to couple the second and fifth external terminals, and the third coupling conductor portion coupling the third and sixth external terminals.

17. The method of claim 15, wherein the step of making the capacitor body includes steps of:
making a substrate portion having a plurality of through holes formed therein; and
making a capacitance forming portion by forming the first conductor film such that the first conductor film covers an inner wall of the through holes and surfaces of the substrate portion in the third direction, by forming the dielectric film such that the dielectric film covers the first conductor film, and by forming the second conductor film such that the second conductor film covers the dielectric film.

* * * * *